United States Patent
Calveras et al.

(10) Patent No.: US 9,110,370 B2
(45) Date of Patent: *Aug. 18, 2015

(54) PHOTOACTIVE ADDITIVE WITH FUNCTIONALIZED BENZOPHENONE

(71) Applicant: SABIC Innovative Plastics IP B.V., Bergen op Zoom (NL)

(72) Inventors: Jordi Calveras, Evansville, IN (US); Jean-Francois Morizur, Evansville, IN (US); Paul Dean Sybert, Evansville, IN (US)

(73) Assignee: SABIC Global Technologies B.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/211,862

(22) Filed: Mar. 14, 2014

(65) Prior Publication Data

US 2014/0272691 A1    Sep. 18, 2014

Related U.S. Application Data

(60) Provisional application No. 61/781,668, filed on Mar. 14, 2013, provisional application No. 61/901,612, filed on Nov. 8, 2013.

(51) Int. Cl.
| | |
|---|---|
| *C08F 2/50* | (2006.01) |
| *B29C 71/04* | (2006.01) |
| *A61L 2/08* | (2006.01) |
| *A61L 24/00* | (2006.01) |
| *C08G 61/04* | (2006.01) |
| *G03F 7/027* | (2006.01) |
| *C08G 64/02* | (2006.01) |
| *C08G 64/14* | (2006.01) |
| *C08G 64/16* | (2006.01) |
| *C08L 69/00* | (2006.01) |

(52) U.S. Cl.
CPC ............ *G03F 7/027* (2013.01); *C08G 64/0216* (2013.01); *C08G 64/14* (2013.01); *C08G 64/1616* (2013.01); *C08L 69/00* (2013.01)

(58) Field of Classification Search
CPC .... G03F 7/027; C08G 64/04; C08G 64/0216; C08G 64/1616; C08L 69/00; C08L 101/00
USPC ............. 522/46, 33, 6, 71, 189, 184, 1; 520/1
See application file for complete search history.

(56) References Cited

U.S. PATENT DOCUMENTS

| | | | |
|---|---|---|---|
| 4,153,780 A | 5/1979 | Narita et al. | |
| 4,221,645 A | 9/1980 | Adelmann et al. | |
| 4,333,809 A | 6/1982 | Schreckenberg et al. | |
| 4,338,171 A * | 7/1982 | Barie et al. | 522/46 |
| 4,367,186 A | 1/1983 | Adelmann et al. | |
| 4,749,726 A | 6/1988 | Gupta et al. | |
| 4,831,109 A | 5/1989 | Mitra et al. | |
| 5,034,496 A | 7/1991 | Bales et al. | |
| 5,916,942 A | 6/1999 | Scholl et al. | |
| 6,224,949 B1 | 5/2001 | Wright et al. | |
| 6,517,910 B2 | 2/2003 | Wright et al. | |
| 6,624,379 B1 | 9/2003 | Thornton et al. | |
| 7,875,698 B2 | 1/2011 | Vanmaele et al. | |
| 2004/0030090 A1 | 2/2004 | Meyer et al. | |
| 2005/0049369 A1 | 3/2005 | O'Neil et al. | |
| 2006/0014850 A1 * | 1/2006 | Vanmaele et al. | 522/25 |
| 2006/0074156 A1 | 4/2006 | Ebeling et al. | |
| 2007/0027268 A1 | 2/2007 | Di et al. | |
| 2007/0105994 A1 | 5/2007 | Li et al. | |
| 2008/0081893 A1 | 4/2008 | Hoover et al. | |
| 2008/0114103 A1 | 5/2008 | Hoeks et al. | |
| 2010/0075125 A1 | 3/2010 | Maas et al. | |
| 2011/0065848 A1 * | 3/2011 | Jung et al. | 524/162 |
| 2012/0253002 A1 | 10/2012 | Ozaki et al. | |
| 2014/0178665 A1 | 6/2014 | Morizur et al. | |
| 2014/0179821 A1 * | 6/2014 | Morizur et al. | 522/35 |
| 2014/0234629 A1 | 8/2014 | Sun et al. | |
| 2014/0265053 A1 | 9/2014 | Morizur et al. | |
| 2014/0275314 A1 | 9/2014 | Morizur et al. | |
| 2014/0275321 A1 | 9/2014 | Morizur et al. | |
| 2014/0275322 A1 | 9/2014 | Morizur et al. | |
| 2014/0275324 A1 | 9/2014 | Morizur et al. | |

FOREIGN PATENT DOCUMENTS

| | | |
|---|---|---|
| DE | 24 01 630 | 8/1974 |
| DE | 27 46 139 A1 | 4/1979 |
| DE | 27 46 141 A1 | 4/1979 |
| DE | 28 29 258 A1 | 1/1980 |
| DE | 29 30 787 A1 | 2/1981 |
| EP | 0 001 577 A1 | 5/1979 |
| EP | 0001577 A1 | 5/1979 |
| EP | 0006579 | 1/1980 |
| EP | 0 068 014 B | 1/1983 |
| EP | 0 347 682 A | 12/1989 |

(Continued)

OTHER PUBLICATIONS

Wang et al, Photocrosslinking of poly(ethylene terephthalate) copolymers containing photoreactive comonomers, Jul. 18, 2005, Polymer, 46, 6897-6909.*
International Search Report for International Application No. PCT/US2014/028101 dated Jul. 8, 2014.
International Search Report and Written Opinion dated Mar. 13, 2014, for corresponding PCT application No. PCT/US2013/077024.
International Search Report and Written Opinion dated Mar. 13, 2014, for corresponding PCT application No. PCT/US2013/077209.
International Search Report and Written Opinion dated Mar. 13, 2014, for corresponding PCT application No. PCT/US2013/077272.

(Continued)

*Primary Examiner* — Ling Choi
*Assistant Examiner* — Jessica E Whiteley
(74) *Attorney, Agent, or Firm* — Richard M. Klein; Fay Sharpe LLP

(57) ABSTRACT

Photoactive additives are disclosed. The additive includes a benzophenone having at least one substituent that comprises a divalent linker and a linking group, wherein the linking group is a carboxyl group, ester group, or acid halide group. The additive can be a polymer, an oligomer, or a compound. When added to a base polymeric resin, the photoactive additive permits crosslinking upon exposure to ultraviolet light.

28 Claims, 8 Drawing Sheets

(56) References Cited

FOREIGN PATENT DOCUMENTS

| | | |
|---|---|---|
| EP | 1359176 A2 | 11/2003 |
| EP | 1093471 B1 | 12/2007 |
| JP | 08-238309 | 9/1996 |
| JP | 3409824 B2 | 9/1996 |
| JP | 2002-226571 | 8/2002 |
| WO | 96/33156 * | 10/1996 |
| WO | WO 96/33156 | 10/1996 |
| WO | WO 98/22522 A | 5/1998 |
| WO | WO 2004/013229 A1 | 2/2004 |
| WO | WO 2014/032616 A1 | 3/2014 |

OTHER PUBLICATIONS

International Search Report and Written Opinion dated Mar. 13, 2014, for corresponding PCT application No. PCT/US2013/076798.
International Search Report and Written Opinion dated Mar. 13, 2014, for corresponding PCT application No. PCT/US2013/076799.
International Search Report and Written Opinion dated Jul. 8, 2014, for corresponding PCT application No. PCT/US2014/028101.
International Search Report and Written Opinion dated Jul. 8, 2014, for corresponding PCT application No. PCT/US2014/028139.
International Search Report and Written Opinion dated Jul. 8, 2014, for corresponding PCT application No. PCT/US2014/028141.
International Search Report and Written Opinion dated Jul. 8, 2014, for corresponding PCT application No. PCT/US2014/026346.
International Search Report and Written Opinion dated Jul. 8, 2014, for corresponding PCT application No. PCT/US2014/026401.
International Search Report and Written Opinion dated Jul. 8, 2014, for corresponding PCT application No. PCT/US2014/028651.
International Search Report and Written Opinion dated Jul. 8, 2014, for corresponding PCT application No. PCT/US2014/028850.
International Search Report and Written Opinion dated Jul. 10, 2014, for corresponding PCT application No. PCT/US2014/29184.
Wang et al., Photocrosslinking of poly(ethylene terephthalate) copolymers containing photoreactive comonomers, Jul. 18, 2005, Polymer, 46, 6897-6909.

* cited by examiner

PHOTOACTIVE ADDITIVE WITH FUNCTIONALIZED BENZOPHENONE

This application claims priority to U.S. Provisional Patent Application Ser. No. 61/781,668, filed Mar. 14, 2013; and to U.S. Provisional Patent Application Ser. No. 61/901,612, filed Nov. 8, 2013. The disclosure of each application is hereby fully incorporated by reference herein.

BACKGROUND

The present disclosure relates to photoactive additives that include a benzophenone having a carboxylate functionality. The additive can be used to crosslink polymers and blends thereof, particularly polycarbonate polymers, to produce compositions having improved properties. Also disclosed are the crosslinked polymers, products thereof, and/or products comprising the same.

Polycarbonates (PC) are synthetic engineering thermoplastic resins, and are a useful class of polymers having many beneficial properties. Polycarbonate resins are both strong and transparent, and are used for a number of different commercial applications, including electronic engineering (E&E) parts, mechanical parts, etc.

Polycarbonate polymers/resins and blends containing polycarbonate polymers are inherently flame retardant. However, they drip when exposed to a flame, and this dripping behavior worsens as the wall thickness decreases. This behavior reduces their suitability for applications where a V0 or 5VA flame retardance rating is required. In addition, polycarbonates have relatively poor chemical resistance. Polymers having better flame retardance, chemical resistance, color properties, and structural diversity are desirable.

BRIEF DESCRIPTION

The present disclosure relates to additives which can be used for crosslinking polycarbonate resins and improve their flame resistance. The additives are formed by the reaction of a benzophenone with a first linker moiety, the benzophenone having one or two substituents formed from a divalent linker and a carboxyl endgroup. The resulting additive can be a polymer, an oligomer, or a compound, and can be used to crosslink polycarbonates when exposed to UV light.

Disclosed in various embodiments is a photoactive additive formed from the reaction of: a benzophenone having one or two substituents that comprise a divalent linker and a linking group, wherein the linking group is a carboxyl group, ester group, or acid halide group; and a first linker moiety comprising a plurality of functional groups that can react with the linking group of the first photoactive moiety.

In some embodiments, the benzophenone contains only one substituent. More particularly, the benzophenone can have the structure of Formula (1):

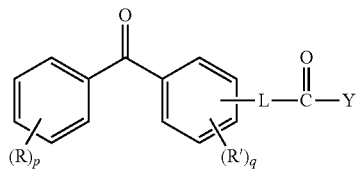

Formula (1)

wherein R and R' are independently alkyl, aryl, alkenyl, halogen, sulfonate, phosphate, phosphonate, nitrile, thiophene, or pyrrole; p is an integer from 0 to 5; q is an integer from 0 to 4; and L is a single bond, oxyalkylene, alkyl, aryl, alkenyl, substituted alkyl, substituted aryl, substituted alkenyl, or amino; and Y is hydroxyl, alkoxy, aryloxy, or halogen; or an anhydride thereof.

In other embodiments, the benzophenone contains two substituents. For example, the benzophenone may have the structure of one of the following Formulas (2)-(3):

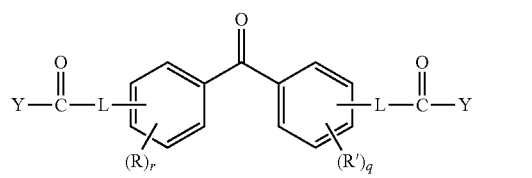

Formula (2)

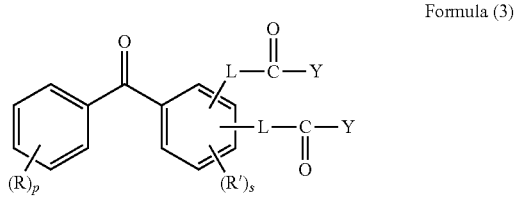

Formula (3)

wherein R and R' are independently alkyl, aryl, alkenyl, halogen, sulfonate, phosphate, phosphonate, nitrile, thiophene, or pyrrole; p is an integer from 0 to 5; q and r are independently an integer from 0 to 4; s is an integer from 0 to 3; and each L is independently a single bond, oxyalkylene, alkyl, aryl, alkenyl, substituted alkyl, substituted aryl, substituted alkenyl, or amino; and Y is hydroxyl, alkoxy, aryloxy, or halogen; or an anhydride thereof.

In some embodiments, the reaction further comprises an end-capping agent selected from the group consisting of phenol, p-t-butylphenol, p-cumylphenol, octylphenol, and p-cyanophenol.

In various embodiments, the first linker moiety has the structure of one of the following Formulas (B)-(I), which are further described herein. In other embodiments, the first linker moiety has the structure of one of the following Formulas (8)-(12), which are further described herein.

In some further embodiments, the reaction that forms the photoactive additive further comprises a secondary linker moiety having at least three functional groups, each of which can react with a functional group of the first linker moiety. Such secondary linker moieties may have the structure of one of the following Formulas (25)-(28), which are further described herein.

In other embodiments, the reaction that forms the photoactive additive further comprises a difunctional chain extender having two functional groups, each of which can react with a functional group of the first linker moiety. Such difunctional chain extenders can have the structure of one of the following Formulas (17)-(24), which are further described herein.

In some additional embodiments, the additive is an oligomer having a weight average molecular weight of less than 15,000 prior to UV exposure. In others, the additive is a polymer having a weight average molecular weight of 15,000 or higher prior to UV exposure.

The molar ratio of the benzophenone to the first linker moiety can be from 1:2 to 1:200 prior to UV exposure.

In particular embodiments, the additive is formed from the reaction of the benzophenone having one substituent, the first linker moiety, and a difunctional chain extender. More specifically, the first linker moiety is bisphenol-A, and the difunctional chain extender is phosgene.

In other particular embodiments, the additive is formed from the reaction of the benzophenone having two substituents, the first linker moiety, a difunctional chain extender, and an end-capping agent.

Additionally disclosed herein in various embodiments are crosslinked layers formed from a polymeric blend that has been exposed to UV radiation. The blend comprises: (i) a photoactive additive that is a cross-linkable polycarbonate resin formed from the reaction of (a) a benzophenone having one or two substituents that comprise a divalent linker and a linking group, wherein the linking group is a carboxyl group, ester group, or acid halide group, and (b) a first linker moiety comprising a plurality of functional groups that can react with the linking group of the first photoactive moiety; and (ii) a separate polymer resin which is not the photoactive additive.

The crosslinked layer can contain chains from both the photoactive additive and the polymer resin. In most embodiments, the crosslinking is sufficient to create a continuous insoluble layer containing both the photoactive additive and the polymer resin. In particular embodiments, the crosslinked layer is formed by exposure to 36.0 J/cm2 of UVA radiation with no detectable UVC radiation.

Also disclosed herein are compositions comprising a cross-linked polycarbonate, the cross-linked polycarbonate derived from a cross-linkable polycarbonate resin formed from the reaction of (a) a benzophenone having one or two substituents that comprise a divalent linker and a linking group, wherein the linking group is a carboxyl group, ester group, or acid halide group, and (b) a first linker moiety comprising a plurality of functional groups that can react with the linking group of the first photoactive moiety.

The cross-linkable polycarbonate resin may contain from about 0.5 mole % to about 5.0 mole % of endcaps derived from the benzophenone having one substituent prior to cross-linking. Alternatively, the cross-linkable polycarbonate resin may contain from about 0.5 mole % to about 50 mole % of the benzophenone having two substituents prior to cross-linking.

These and other non-limiting characteristics are more particularly described below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
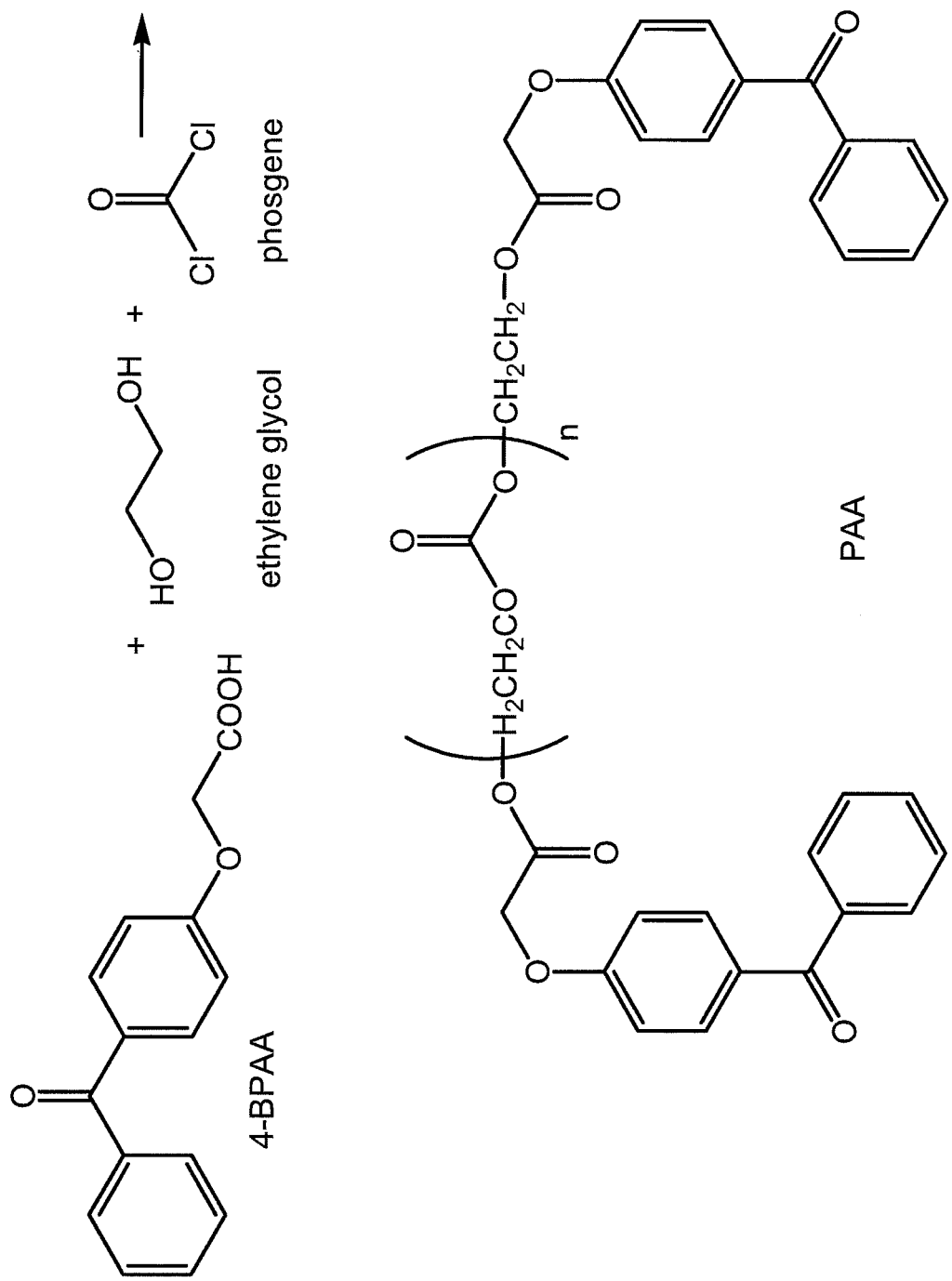
FIG. 1 illustrates the reaction of the benzophenone with one carboxylate linking group, a first linker moiety, and a difunctional chain extender to form the photoactive additive (oligomer/polymer).

The present disclosure may be understood more readily by reference to the following detailed description of desired embodiments and the examples included therein. In the following specification and the claims which follow, reference will be made to a number of terms which shall be defined to have the following meanings.

Definitions

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

Numerical values in the specification and claims of this application, particularly as they relate to polymers or polymer compositions, reflect average values for a composition that may contain individual polymers of different characteristics. Furthermore, unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, the aldehyde group —CHO is attached through the carbon of the carbonyl group.

The term "aliphatic" refers to an linear or branched array of atoms that is not aromatic. The backbone of an aliphatic group is composed exclusively of carbon. The aliphatic group may be substituted or unsubstituted. Exemplary aliphatic groups include, but are not limited to, methyl, ethyl, isopropyl, hexyl, and cyclohexyl.

The term "aromatic" refers to a radical having a ring system containing a delocalized conjugated pi system with a number of pi-electrons that obeys Hückel's Rule. The ring system may include heteroatoms such as nitrogen, sulfur, selenium, silicon and oxygen, or may be composed exclusively of carbon and hydrogen. Aromatic groups are not substituted. Exemplary aromatic groups include, but are not limited to, phenyl, pyridyl, furanyl, thienyl, naphthyl and biphenyl.

The term "ester" refers to a radical of the formula —CO—O—, wherein the carbon atom and the oxygen atom are both covalently bonded to carbon atoms.

The term "carbonate" refers to a radical of the formula —O—CO—O—, wherein the oxygen atoms are both covalently bonded to carbon atoms. Note that a carbonate group is not an ester group, and an ester group is not a carbonate group.

The term "hydroxyl" refers to a radical of the formula —OH, wherein the oxygen atom is covalently bonded to a carbon atom that is not double bonded to an oxygen atom.

The terms "carboxy" or "carboxyl" refer to a radical of the formula —COOH, wherein the carbon atom is covalently bonded to another carbon atom.

The term "anhydride" refers to a radical of the formula —CO—O—CO—, wherein the carbonyl carbon atoms are covalently bonded to other carbon atoms. An anhydride can be considered as being equivalent to two carboxyl groups.

The term "acid halide" refers to a radical of the formula —CO—X, wherein the carbon atom is covalently bonded to another carbon atom.

The term "alkyl" refers to a radical composed entirely of carbon atoms and hydrogen atoms which is fully saturated. The alkyl radical may be linear, branched, or cyclic. This term may refer to a monovalent radical or a divalent radical, depending on the context. Examples of alkyl radicals include —CH$_3$, —CH$_2$, —CH$_2$CH$_3$, and —CH$_2$CH$_2$—.

The term "aryl" refers to an aromatic radical that is composed exclusively of carbon and hydrogen. This term may refer to a monovalent radical or a divalent radical, depending on the context. Exemplary aryl groups include phenyl, naphthyl, biphenyl, and phenylene (—C$_6$H$_4$—). Note that "aryl" is a subset of aromatic.

The term "heteroaryl" refers to an aromatic radical having a ring system that is composed of carbon, hydrogen, and at least one heteroatom. Exemplary heteroaryl groups include pyridyl, furanyl, and thienyl. Note that "heteroaryl" is a subset of aromatic, and is exclusive of "aryl".

The term "halogen" refers to fluorine, chlorine, bromine, and iodine.

The term "alkoxy" refers to an alkyl radical which is attached to an oxygen atom, i.e. —O—C$_n$H$_{2n+1}$.

The term "aryloxy" refers to an aryl radical which is attached to an oxygen atom, e.g. —O—C$_6$H$_5$.

The term "hydrocarbon" refers to a radical which is composed exclusively of carbon and hydrogen. Both alkyl and aryl groups are considered hydrocarbon groups.

The term "alkenyl" refers to a radical composed entirely of carbon atoms and hydrogen atoms which contains at least one carbon-carbon double bond that is not part of an aromatic structure. The alkenyl radical may be linear, branched, or cyclic. An exemplary alkenyl radical is vinyl (—CH=CH$_2$).

The term "alkenyloxy" refers to a alkenyl radical which is attached to an oxygen atom, e.g. —O—CH=CH$_2$.

The term "arylalkyl" refers to an aryl radical which is attached to an alkyl radical, with the aryl radical being appended to the parent molecular moiety through the alkyl radical, e.g. benzyl (—CH$_2$—C$_6$H$_5$).

The term "alkylaryl" refers to an alkyl radical which is attached to an aryl radical, with the alkyl radical being appended to the parent molecular moiety through the aryl radical, e.g. tolyl (—C$_6$H$_4$—CH$_3$).

The term "amino" refers to a radical of the formula R—NR$^1$R$^2$, wherein R is a carbon atom, R1 is hydrogen or alkyl, and R$^2$ is hydrogen, alkyl, or a single bond. An amino group can therefore be a primary group, a secondary group, a tertiary group, or a divalent group.

The term "amide" refers to a radical of the formula —CO—NH—, wherein the nitrogen atom and the carbon atom are both covalently bonded to carbon atoms.

The term "oxyalkylene" refers to a divalent radical of the formula —(OR$^1$)$_m$—, wherein each R$^1$ is independently alkyl; m is an integer and is 1 or higher.

The term "sulfonate" refers to a radical of the formula —SO$_3$$^{1-}$, or its chemical equivalents.

The term "phosphate" refers to a radical of the formula:

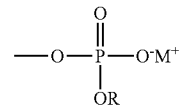

where R is hydrogen or alkyl; and M is an alkali metal.

The term "phosphonate" refers to a radical of the formula:

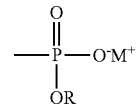

where R is hydrogen or alkyl; and M is an alkali metal.

The term "nitrile" refers to a radical of the formula —C≡N.

The term "pyrrole" refers to the heterocyclic radical of the formula —C$_4$H$_4$N, which may be attached through any of the carbon atoms or the nitrogen atom, and which is aromatic.

The term "thiophene" refers to the heterocyclic radical of the formula —C$_4$H$_3$S, which may be attached through any of the carbon atoms, and which is aromatic.

The term "nitro" refers to a radical of the formula —NO$_2$.

The term "substituted" refers to at least one hydrogen atom on the named radical being substituted with another functional group, such as halogen, —CN, or —NO$_2$. However, the functional group is not hydroxyl, carboxyl, ester, acid halide, or anhydride. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. Exemplary substituted aryl groups include methylphenyl and methoxyphenyl. Exemplary substituted heteroaryl groups include dodecylthienyl.

The term "copolymer" refers to a polymer derived from two or more structural unit or monomeric species, as opposed to a homopolymer, which is derived from only one structural unit or monomer.

The terms "Glass Transition Temperature" or "Tg" refer to the maximum temperature that a polymer, such as a polycarbonate, will have one or more useful properties. These properties include impact resistance, stiffness, strength, and shape retention. The Tg of a polycarbonate therefore may be an indicator of its useful upper temperature limit, particularly in plastics applications. The Tg may be measured using a differential scanning calorimetry method and expressed in degrees Celsius. The glass transition temperatures (Tg) described herein are measures of heat resistance of, for example, polycarbonate and polycarbonate blends. The Tg can be determined by differential scanning calorimetry, for example by using a TA Instruments Q1000 instrument, for example, with setting of 20° C./min ramp rate and 40° C. start temperature and 200° C. end temperature.

The term "halo" means that the substituent to which the prefix is attached is substituted with one or more independently selected halogen radicals. For example, "$C_1$-$C_6$ haloalkyl" means a $C_1$-$C_6$ alkyl substituent wherein one or more hydrogen atoms are replaced with independently selected halogen radicals. Non-limiting examples of $C_1$-$C_6$ haloalkyl include chloromethyl, 1-bromoethyl, fluoromethyl, difluoromethyl, trifluoromethyl, and 1,1,1-trifluoroethyl. It should be recognized that if a substituent is substituted by more than one halogen radical, those halogen radicals may be identical or different (unless otherwise stated).

The term "haze" refers to the percentage of transmitted light, which in passing through a specimen deviates from the incident beam by forward scattering. Percent (%) haze may be measured according to ASTM D 1003-07.

The term "Melt Volume Rate" (MVR) or "Melt Flow Rate (MFR)" refers to the flow rate of a polymer in a melt phase as determined using the method of ASTM D1238-10. The MVR of a molten polymer is measured by determining the amount of polymer that flows through a capillary of a specific temperature over a specified time using standard weights at a fixed temperature. MVR is expressed in cubic centimeter per 10 minutes, and MFR is expressed in grams per 10 minutes. The higher the MVR or MFR value of a polymer at a specific temperature, the greater the flow of that polymer at that specific temperature.

The term "Percent transmission" or "% transmission" refers to the ratio of transmitted light to incident light, and may be measured according to ASTM D 1003-07.

"Polycarbonate" as used herein refers to an oligomer or a polymer comprising residues of one or more monomers, joined by carbonate linkages.

"Thermal stability" as used herein refers to resistance of a polymer to molecular weight degradation under thermal conditions. Thus, a polymer with poor thermal stability may show significant molecular weight degradation under thermal conditions, such as during extrusion, molding, thermoforming, hot-pressing, and like conditions. Molecular weight degradation may also be manifest through color formation and/or in the degradation of other properties such as weatherability, gloss, mechanical properties, and/or thermal properties. Molecular weight degradation can also cause significant variation in processing conditions such as melt viscosity changes.

The term "crosslink" and its variants refer to the formation of a stable covalent bond between two oligomers/polymers. This term is intended to encompass the formation of covalent bonds that result in network formation, or the formation of covalent bonds that result in chain extension. The term "cross-linkable" refers to the ability of an oligomer/polymer to form such stable covalent bonds.

The present disclosure refers to "polymers," "oligomers", and "compounds". A polymer is a large molecule composed of multiple repeating units chained together, the repeating units being derived from a monomer. One characteristic of a polymer is that different molecules of a polymer will have different lengths, and a polymer is described as having a molecular weight that is based on the average value of the chains (e.g. weight average or number average molecular weight). The art also distinguishes between an "oligomer" and a "polymer", with an oligomer having only a few repeating units, while a polymer has many repeating units. For purposes of this disclosure, the term "oligomer" refers to such molecules having a weight average molecular weight of less than 15,000, and the term "polymer" refers to molecules having a weight average molecular weight of 15,000 or more, as measured by GPC using polycarbonate molecular weight standards. In contrast, for a compound, all molecules will have the same molecular weight. Compared to a polymer, a compound is a small molecule. These molecular weights are measured prior to any UV exposure.

Additives

The present disclosure relates to photoactive additives (PAA), and to compositions containing such additives. When the photoactive additive is added to one or more base resins and is then exposed to the appropriate wavelength of light, the resulting composition will have improved anti-drip and flame retardant properties compared to the base resins alone or to the composition prior to the light exposure. For example, the chemical resistance, propensity to drip during burning, or the propensity to form a hole when exposed to a flame can be improved. Improved flame resistance performance characteristics may include flame out time (FOT) and time to drip (TTD). The compositions, blended or neat, can be used to provide thin-walled materials that are UL94 5VA compliant. The compositions can be used to provide thin-walled materials that are 5VA compliant and highly transparent. The compositions may also exhibit good chemical resistance, tear resistance, impact strength, ductility, hydrolytic stability, and/or weatherability.

Generally, the photoactive additives (PAA) of the present disclosure include photoactive moieties that are covalently linked together through a first linker moiety and possibly a secondary linker moiety. The photoactive moieties contain a photoactive ketone group that, when exposed to the appropriate wavelength(s) of ultraviolet light, will form a stable covalent bond between the PAA and the polymeric resin. The PAA should be stable at conventional blending, forming, and processing temperatures (i.e. stable at 350° C. or above). The PAA also should not induce the degradation of the polymeric resin with which it is blended.

The term "photoactive" refers to a moiety that, when exposed to ultraviolet light of the appropriate wavelength, crosslinks with another molecule. Thus, for example, the bisphenol-A monomer in a bisphenol-A homopolymer would not be considered to be photoactive, even though photo-Fries rearrangement can occur upon exposure to light, because the atoms do not participate in crosslinking but merely in rearrangement of the polymer backbone.

The term "ketone group" refers to a carbonyl group (—CO—) that is bonded to two other carbon atoms (i.e. —R—CO—R'—). The two other carbon atoms can be in an aliphatic group or in an aromatic group. An ester group and a carboxylic acid group are not considered to be a ketone group because the carbonyl group is bonded to one carbon atom and an oxygen atom.

The photoactive additive is formed from a reaction mixture containing at least a benzophenone and a first linker moiety. The benzophenone has one or two substituents that comprise a divalent linker and a linking group, wherein the linking group can be a carboxyl, ester, acid halide, or an anhydride thereof. The first linker moiety comprises a plurality of functional groups that can react with the linking group(s) of the benzophenone. The reaction product is the photoactive additive (PAA). The molar ratio of the benzophenone to the first linker moiety can be from 1:2 to 1:200. Depending on whether the benzophenone is monofunctional or difunctional, an end-capping agent may also be included. As desired, a difunctional chain extender can also be included. The end-capping agent and the difunctional chain extender do not have photoactive properties.

The linking group(s) of the photoactive moiety can be a carboxyl, ester, acid halide, or an anhydride thereof. These four groups react in the same way, and are thus considered to be equivalent to each other. For clarity, these four groups are illustrated below:

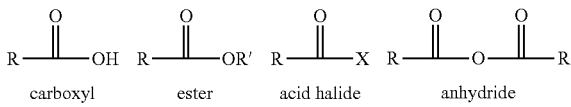

wherein R is the remainder of the photoactive moiety, R' is alkyl or aryl, and X is a halogen. It should be noted that the anhydride essentially contains two carboxyl groups.

The benzophenone includes a substituent that has the linking group as the endgroup (i.e at the end of the substituent). A divalent linker joins the linking group to the benzophenone. The term "divalent linker" refers to a moiety which is able to form a single bond with two different non-hydrogen atoms, joining those two different atoms together. Exemplary divalent linkers include —CO—, —O—, —NH—, alkyl, aryl, and combinations thereof, and also include the single bond that can formed directly between the two different non-hydrogen atoms themselves.

In some embodiments, the benzophenone has only one substituent, and has the structure of Formula (1):

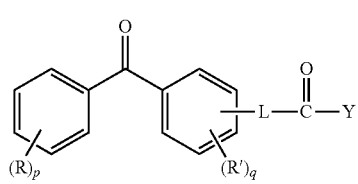

wherein R and R' are independently alkyl, aryl, alkenyl, halogen, sulfonate, phosphate, phosphonate, nitrile, thiophene, or pyrrole; p is an integer from 0 to 5; q is an integer from 0 to 4; and L is a single bond, oxyalkylene, alkyl, aryl, alkenyl, substituted alkyl, substituted aryl, substituted alkenyl, or amino; Y is hydroxyl, alkoxy, aryloxy, or halogen; or is the anhydride thereof. In more specific embodiments, L is oxyalkylene having 1 to 4 carbon atoms, and p=q=0.

In particular embodiments, the substituent is located at the 4-(para-) position on the phenyl ring. A specific example of a benzophenone of Formula (1) is (4-benzoylphenoxy) acetic acid, illustrated below as Formula (1-a) (where L is oxyalkylene, m=1) and abbreviated herein as 4-BPAA:

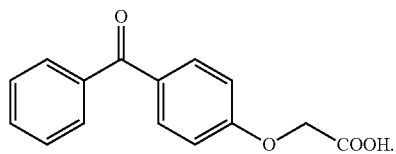

In other embodiments, the benzophenone has only two substituents, one substituent on each phenyl ring, and has the structure of Formula (2):

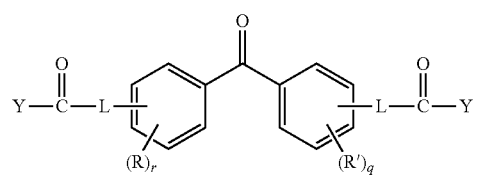

wherein R and R' are independently alkyl, aryl, alkenyl, halogen, sulfonate, phosphate, phosphonate, nitrile, thiophene, or pyrrole; q and r are independently an integer from 0 to 4; and each L is independently a single bond, oxyalkylene, alkyl, aryl, alkenyl, substituted alkyl, substituted aryl, substituted alkenyl, or amino; Y is hydroxyl, alkoxy, aryloxy, or halogen; or is the anhydride thereof. It should be noted that depending on the location of the two substituents, it is possible for the two linking groups to form an anhydride with themselves, rather than with another molecule. In more specific embodiments, L is oxyalkylene having 1 to 4 carbon atoms, and q=r=0.

The two substituents can be located in any combination of locations, e.g. 4,4'-; 2,2'-; 2,4'-; etc. Some specific examples of benzophenones of Formula (2) are illustrated below as Formulas (2-a) and (2-b). It is noted that the IUPAC name for the structure of Formula (2-a) is 2-[4-[4-(carboxymethoxy)benzoyl]phenoxy]acetic acid (abbreviated herein as p,p'-CMOBPAA).

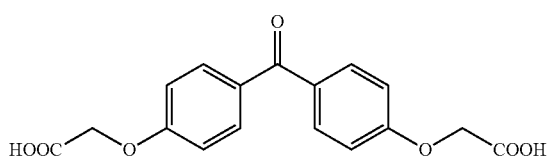

Formula (2-b)

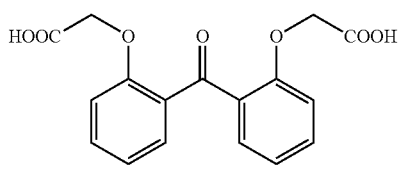

In still other embodiments, the benzophenone has only two substituents, both located on the same phenyl ring, and has the structure of Formula (3):

Formula (3)

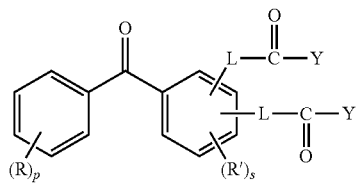

wherein R and R' are independently alkyl, aryl, alkenyl, halogen, sulfonate, phosphate, phosphonate, nitrile, thiophene, or pyrrole; p is an integer from 0 to 5; s is an integer from 0 to 3; and each L is independently a single bond, oxyalkylene, alkyl, aryl, alkenyl, substituted alkyl, substituted aryl, substituted alkenyl, or amino; Y is hydroxyl, alkoxy, aryloxy, or halogen; or is the anhydride thereof. It should be noted that depending on the location of the two substituents, it is possible for the two linking groups to form an anhydride with themselves, rather than with another molecule. In more specific embodiments, L is oxyalkylene having 1 to 4 carbon atoms, and p=s=0.

The two substituents can be located in any combination of locations, e.g. 2,4-; 3,4-; 3,5-; etc. Some specific examples of benzophenones of Formula (3) are illustrated below as Formulas (3-a) and (3-b):

Formula (3-a)

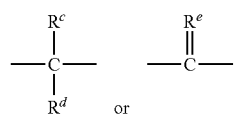

Formula (3-b)

It should be noted that in relation to the divalent linker L in Formulas (1)-(3), the term "amino" refers to a radical of the formula —$NR^1$—, wherein $R^1$ is hydrogen or alkyl. Here, the amino group will not be a primary amino group, i.e. will not have two hydrogen atoms.

The benzophenone is reacted with one or more first linker moieties. The linker moiety comprises a plurality of functional groups that can react with the carboxylate linking group on the substituent(s) of the benzophenone. Examples of such functional groups include a hydroxyl group. The functional groups can be joined to an aliphatic group or an aromatic group which serves as a "backbone" for the first linker moiety. In particular embodiments, the first linker moiety can have two, three, four, or even more functional groups. As a result, depending on its identity and on the other ingredients in the reaction, the first linker moiety can act as a branching agent. The first linker moiety is not photoactive when exposed to light. The first linker moiety can be used to provide a desired level of miscibility when the additive is mixed with the polymeric resin.

An exemplary first linker moiety is a bisphenol of Formula (B):

(B)

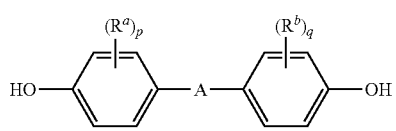

wherein $R^a$ and $R^b$ each represent a halogen atom or a monovalent hydrocarbon group and may be the same or different; p and q are each independently integers of 0 to 4; and A represents one of the groups of formula (B-1):

(B-1)

$$\begin{array}{cc} R^c & R^e \\ | & \| \\ -C- & -C- \\ | & \\ R^d & \text{or} \end{array}$$

wherein $R^c$ and $R^d$ each independently represent a hydrogen atom or a monovalent linear or cyclic hydrocarbon group and $R^e$ is a divalent hydrocarbon group. For example, A can be a substituted or unsubstituted $C_3$-$C_{18}$ cycloalkylidene.

Specific examples of the types of bisphenol compounds that may be represented by Formula (B) include 1,1-bis(4-hydroxyphenyl)methane, 1,1-bis(4-hydroxyphenyl)ethane, 2,2-bis(4-hydroxyphenyl)propane (hereinafter "bisphenol-A" or "BPA"), 2,2-bis(4-hydroxyphenyl) butane, 2,2-bis(4-hydroxyphenyl)octane, 1,1-bis(4-hydroxyphenyl)propane, 1,1-bis(4-hydroxyphenyl) n-butane, 2,2-bis(4-hydroxy-1-methylphenyl)propane, and 1,1-bis(4-hydroxy-t-butylphenyl)propane; 4,4'-(1-phenylethane-1,1-diyl)diphenol or 1,1-bis(4-hydroxyphenyl)-1-phenyl-ethane (bisphenol-AP); and 1,1-bis(4-hydroxyphenyl)-3,3,5-trimethylcyclohexane) (bisphenol TMC).

Another exemplary first linker moiety is a bisphenol of Formula (C):

(C)

wherein each $R^k$ is independently a $C_{1-10}$ hydrocarbon group, and n is 0 to 4. The halogen is usually bromine. Examples of compounds that may be represented by Formula (C) include resorcinol, substituted resorcinol compounds such as 5-methyl resorcinol, 5-phenyl resorcinol, or 5-cumyl resorcinol; catechol; hydroquinone; and substituted hydroquinones such as 2-methyl hydroquinone, 2-t-butyl hydroquinone, 2-phenyl hydroquinone, 2-cumyl hydroquinone, or 2,3,5,6-tetramethyl hydroquinone.

Still another exemplary first linker moiety is a bisphenolpolydiorganosiloxane of Formula (D-1) or (D-2):

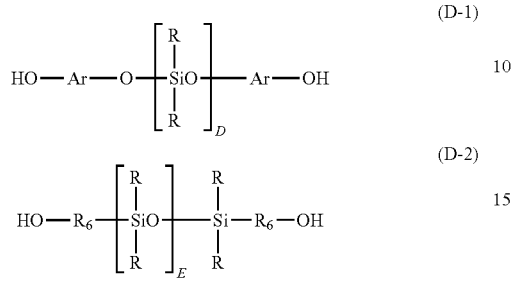

wherein each Ar is independently aryl; each R is independently alkyl, alkoxy, alkenyl, alkenyloxy, aryl, aryloxy, arylalkyl, or alkylaryl; each $R_6$ is independently a divalent $C_1$-$C_{30}$ organic group such as a $C_1$-$C_{30}$ alkyl, $C_1$-$C_{30}$ aryl, or $C_1$-$C_{30}$ alkylaryl; and D and E are an average value of 2 to about 1000, specifically about 2 to about 500, or about 10 to about 200, or more specifically about 10 to about 75.

Specific examples of Formulas (D-1) or (D-2) are illustrated below as Formulas (D-a) through (D-d):

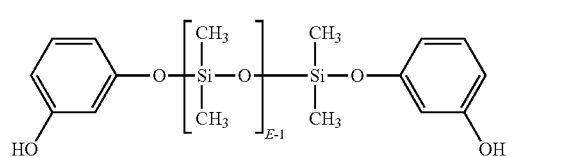

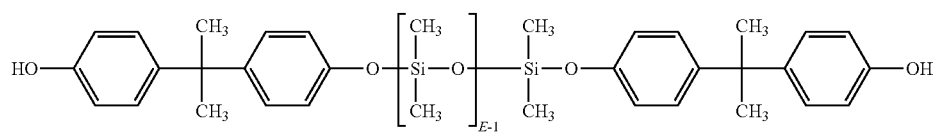

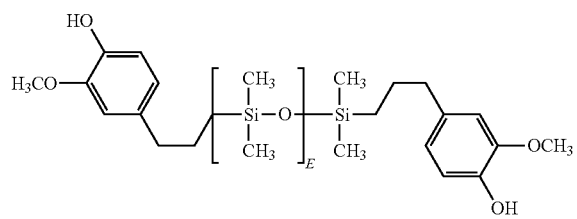

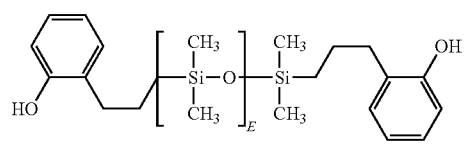

where E is an average value from 10 to 200.

Another exemplary first linker moiety is an aliphatic diol of Formula (E):

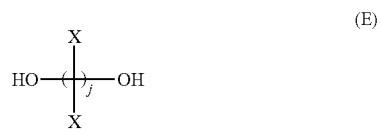

wherein each X is independently hydrogen, halogen, or alkyl; and j is an integer from 1 to 20. Examples of an aliphatic diol include ethylene glycol, propanediol, 2,2-dimethyl-propanediol, 1,6-hexanediol, and 1,12-dodecanediol.

Another interesting first linker moiety is a dihydroxy compound of Formula (F), which may be useful for high heat applications:

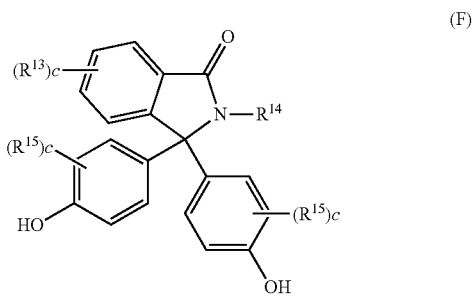

wherein $R^{13}$ and $R^{15}$ are each independently a halogen or a $C_1$-$C_6$ alkyl group, $R^{14}$ is a $C_1$-$C_6$ alkyl, phenyl, or phenyl substituted with up to five halogens or $C_1$-$C_6$ alkyl groups, and c is 0 to 4. In a specific embodiment, $R^{14}$ is a $C_1$-$C_6$ alkyl or phenyl group. In still another embodiment, $R^{14}$ is a methyl or phenyl group. In another specific embodiment, each c is 0. Compounds of Formula (F) include 3,3-bis(4-hydroxyphenyl)-2-phenylisoindolin-1-one (PPPBP).

Other dihydroxy compounds (i.e. first linker moiety) that might impart high Tgs to the polycarbonate as a copolycarbonate are dihydroxy compounds having adamantane units, as described in U.S. Pat. No. 7,112,644 and U.S. Pat. No. 3,516,968, which are fully incorporated herein by reference. A compound having adamantane units may have repetitive units of the following formula (G) for high heat applications:

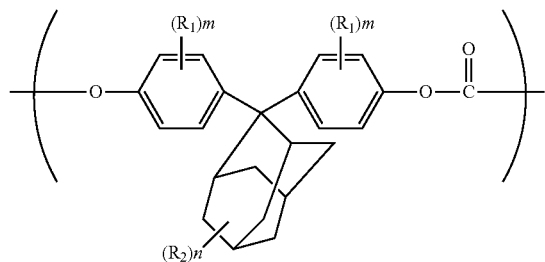

(G)

wherein $R_1$ represents a halogen atom, an alkyl group having 1 to 6 carbon atoms, an alkoxy group having 1 to 6 carbon atoms, an aryl group having 6 to 12 carbon atoms, an aryl-substituted alkenyl group having 7 to 13 carbon atoms, or a fluoroalkyl group having 1 to 6 carbon atoms; $R_2$ represents a halogen atom, an alkyl group having 1 to 12 carbon atoms, an alkoxy group having 1 to 12 carbon atoms, an aryl group having 6 to 12 carbon atoms, an aryl-substituted alkenyl group having 7 to 13 carbon atoms, or a fluoroalkyl group having 1 to 12 carbon atoms; m represents an integer of 0 to 4; and n represents an integer of 0 to 14.

Other dihydroxy compounds that might impart high Tgs to the polycarbonate as a copolycarbonate are dihydroxy compounds having fluorene-units, as described in U.S. Pat. No. 7,244,804. One such fluorene-unit containing dihydroxy compound (i.e. first linker moiety) is represented by the following formula (H) for high heat applications:

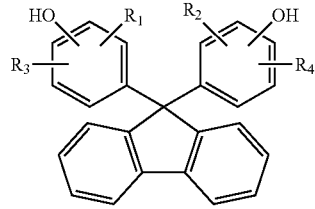

(H)

wherein $R_1$ to $R_4$ are each independently a hydrogen atom, a hydrocarbon group with 1 to 9 carbon atoms which may contain an aromatic group, or a halogen atom.

Another first linker moiety that could be used is an isosorbide. A monomer unit derived from isosorbide may be an isorbide-bisphenol unit of Formula (I):

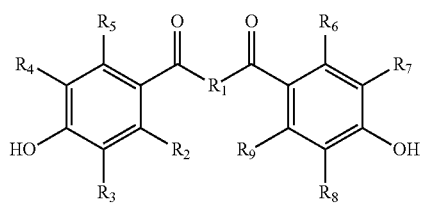

(I)

wherein $R_1$ is an isosorbide unit and $R_2$-$R_9$ are each independently a hydrogen, a halogen, a $C_1$-$C_6$ alkyl, a methoxy, an ethoxy, or an alkyl ester.

The $R_1$ isosorbide unit may be represented by Formula (I-a):

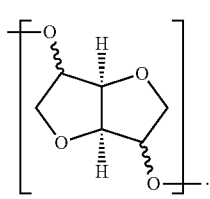

(I-a)

The isosorbide unit may be derived from an isosorbide, a mixture of isosorbide, a mixture of isomers of isosorbide, and/or from individual isomers of isosorbide. The stereochemistry for the isosorbide-based carbonate units of Formula (I) is not particularly limited. These diols may be prepared by the dehydration of the corresponding hexitols. Hexitols are produced commercially from the corresponding sugars (aldohexose). Aliphatic diols include 1,4:3,6-dianhydro-D glucitol; 1,4:3,6-dianhydro-D mannitol; and 1,4:3,6-dianhydro-L iditol; and any combination thereof. Isosorbides are available commercially from various chemical suppliers including Cargill, Roquette, and Shanxi. The isosorbide-bisphenol may have a pKa of between 8 and 11.

Some examples of first linker moieties which have three functional groups and can react with the benzophenone include those having the structure of one of Formulas (8)-(12):

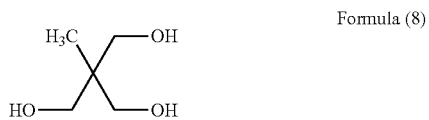

Formula (8)

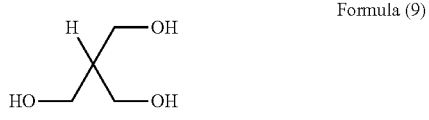

Formula (9)

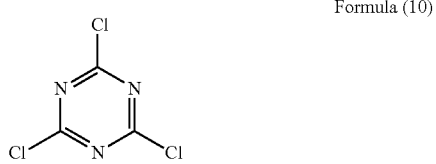

Formula (10)

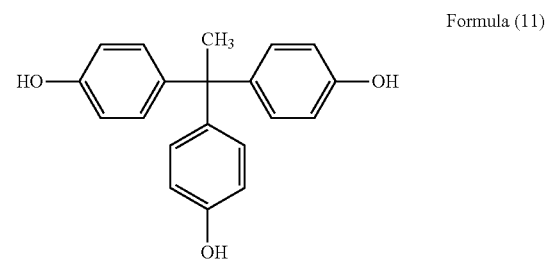

Formula (11)

Formula (12)

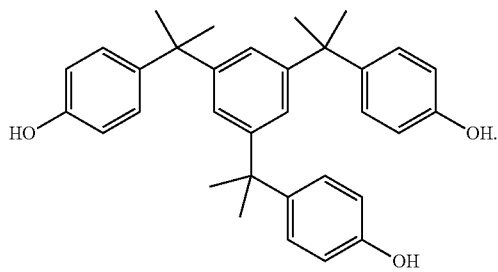

Some examples of first linker moieties which have four functional groups and can react with the benzophenone include those having the structure of one of Formulas (13)-(14):

Formula (13)

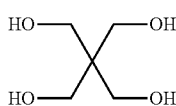

Formula (14)

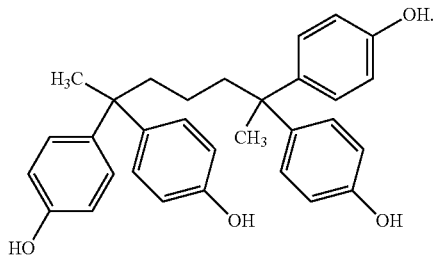

In some embodiments, the first linker moiety can be a short oligomer, including oligomers containing glycidyl methacrylate monomers with styrene or methacrylate monomers, or epoxidized novolac resins. These oligomers can permit the desired number of functional groups to be provided. Such oligomers are generalized by the structure of Formula (15):

Formula (15)

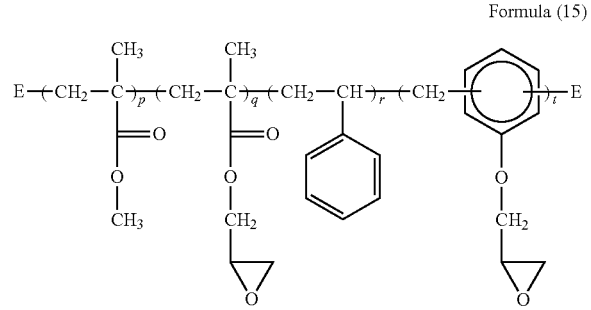

where E is hydrogen or an endcapping agent, p is the number of methacrylate monomers, q is the number of methacrylate monomers, r is the number of styrene monomers, and t is the number of epoxidized novolac (phenol-formaldehyde) monomers. Generally, $p+q+r+t \leq 20$. When the oligomer contains glycidyl methacrylate monomers or methacrylate monomers, generally $t=0$ and $q \geq 1$. Similarly, for novolac resins, $p=q=r=0$. The epoxy groups can be reacted with the phenolic group of the photoactive moiety.

In other embodiments, the first linker moiety can be an oligomer, made from an epoxidized novolac monomer. Such oligomers are generalized by the structure of Formula (16):

Formula (16)

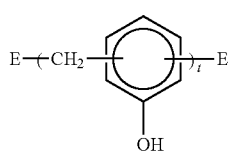

wherein E is hydrogen or an endcapping agent; and t is an integer from 1 to 20.

If desired, the photoactive additive can be formed from a reaction mixture containing the benzophenone, the first linker moiety, and one or more difunctional chain extenders. The difunctional chain extender is a molecule that contains only two linking groups and is not photoactive when exposed to light, and reacts with the first linker moiety. The chain extender is useful in forming oligomeric and polymeric forms of the photoactive additive. The linking groups in the difunctional chain extender are generally the same as those on the benzophenone: carboxyl, ester, acid halide, alkoxy, aryloxy, or anhydride.

One example of a difunctional chain extender is the compound of Formula (17):

Formula (17)

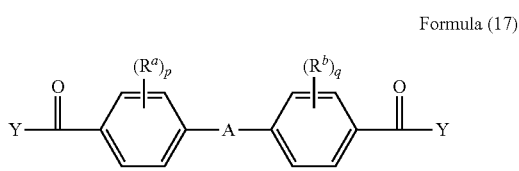

wherein Y is hydroxyl, alkoxy, aryloxy, or halogen; $R^a$ and $R^b$ each represent a halogen atom or a monovalent hydrocarbon group and may be the same or different; p and q are each independently integers of 0 to 4; and A represents one of the groups of formula (17-a):

(17-a)

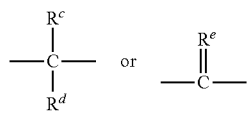

wherein $R^c$ and $R^d$ each independently represent a hydrogen atom or a monovalent linear or cyclic hydrocarbon group and $R^e$ is a divalent hydrocarbon group.

A second example of a difunctional chain extender is the compound of Formula (18):

Formula (18)

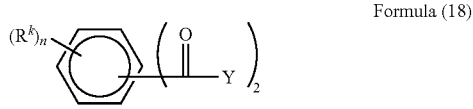

wherein Y is hydroxyl, alkoxy, aryloxy, or halogen; each $R^k$ is independently a $C_{1-10}$ hydrocarbon group, and n is 0 to 4. The halogen is usually bromine.

A third example of a difunctional chain extender is the compound of Formula (19):

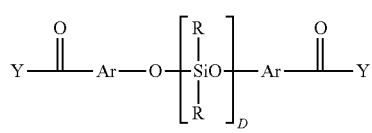

Formula (19)

wherein Y is hydroxyl, alkoxy, aryloxy, or halogen; each Ar is independently aryl; each R is independently alkyl, alkoxy, alkenyl, alkenyloxy, aryl, aryloxy, arylalkyl, or alkylaryl; and D is an average value of 2 to about 1000, specifically about 2 to about 500, more specifically about 10 to about 75.

A fourth example of a difunctional chain extender is the compound of Formula (20):

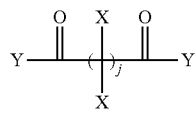

Formula (20)

wherein Y is hydroxyl, alkoxy, aryloxy, or halogen; each X is independently hydrogen, halogen, or alkyl; and j is an integer from 1 to 20.

Other examples of difunctional chain extenders include those having the structure of one of Formulas (21)-(24):

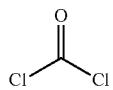

Formula (21)

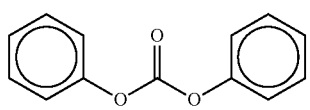

Formula (22)

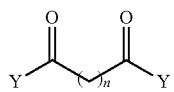

Formula (23)

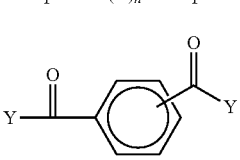

Formula (24)

where Y is hydroxyl, halogen, alkoxy, or aryloxy; and where n is 1 to 20. It should be noted that Formula (24) encompasses isophthalic acid and terephthalic acid.

As mentioned above, some first linker moieties can act as a branching agent, and the first linker moiety will react with the benzophenone. If desired, a secondary linker moiety can be included in the reaction mixture as a branching agent. The secondary linker moiety has at least three functional groups, each of which can react with the functional groups of the first linker moiety. Generally, the functional groups of the secondary linker moiety are the same as those on the benzophenone: carboxyl, ester, acid halide, or anhydride.

Some examples of secondary linker moieties which have three functional groups and can react with the first linker moiety include those having the structure of one of Formulas (25)-(26):

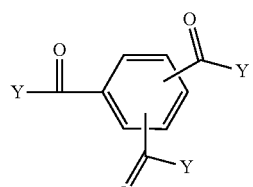

Formula (25)

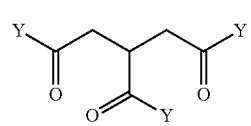

Formula (26)

where Y is hydroxyl, halogen, alkoxy, or aryloxy.

Some examples of secondary linker moieties which have four functional groups and can react with the first linker moiety include those having the structure of one of Formulas (27)-(28):

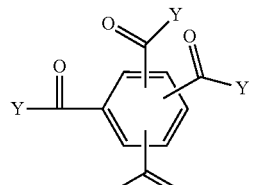

Formula (27)

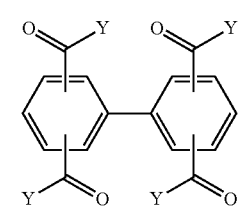

Formula (28)

where Y is hydroxyl, halogen, alkoxy, or aryloxy.

An end-capping agent is generally used to terminate any polymer chains of the photoactive additive. The end-capping agent (i.e. chain stopper) is a monohydroxy compound, a mono-acid compound, or a mono-ester compound. Exemplary endcapping agents include phenol, p-cumylphenol (PCP), resorcinol monobenzoate, p-tert-butylphenol, octylphenol, p-cyanophenol, and p-methoxyphenol. If not modified with other adjectives, the term "end-capping agent" is used herein to denote a compound that is not photoactive when exposed to light. For example, the end-capping agent does not contain a ketone group. The photoactive additive may comprise about 0.5 mole % to about 5.0 mole % endcap groups derived from the end-capping agent. It should also be recognized that the benzophenone having one substituent (Formula (1)) acts as an end-capping agent.

Depending on the selection of the first linker moiety, the photoactive additive of the present disclosure may be a polyester-polycarbonate copolymer. The molar ratio of ester units to carbonate units in the polyester-polycarbonate may vary broadly, for example 1:99 to 99:1, specifically 10:90 to 90:10, more specifically 25:75 to 75:25, optionally expanded depending on the desired properties of the final composition. The polyester units may be derived from an aliphatic or aromatic dicarboxylic acid. Aliphatic dicarboxylic acids may have from 6 to about 36 carbon atoms, optionally from 6 to 20 carbon atoms. Exemplary aliphatic dicarboxylic acids include adipic acid, sebacic acid, 3,3-dimethyl adipic acid, 3,3,6-trimethyl sebacic acid, 3,3,5,5-tetramethyl sebacic acid, azelaic acid, dodecanedioic acid, dimer acids, cyclohexane dicarboxylic acids, dimethyl cyclohexane dicarboxylic acid, norbornane dicarboxylic acids, adamantane dicarboxylic acids, cyclohexene dicarboxylic acids, or $C_{14}$, $C_{18}$ and $C_{20}$ diacids. Exemplary aromatic dicarboxylic acids include isophthalic or terephthalic acid, 1,2-di(p-carboxyphenyl) ethane, 4,4'-dicarboxydiphenyl ether, 4,4'-bisbenzoic acid; 1,4-, 1,5-, or 2,6-naphthalenedicarboxylic acids; and combinations comprising at least one of the foregoing acids. A specific dicarboxylic acid mixture comprises a combination of isophthalic acid and terephthalic acid wherein the weight ratio of isophthalic acid to terephthalic acid is about 91:9 to about 2:98.

The polyester unit of a polyester-polycarbonate may be derived from the reaction of a combination of isophthalic and terephthalic diacids (or derivatives thereof) with resorcinol. In another embodiment, the polyester unit of a polyester-polycarbonate may be derived from the reaction of a combination of isophthalic acid and terephthalic acid with bisphenol-A. In an embodiment, the polycarbonate units may be derived from bisphenol-A. In another specific embodiment, the polycarbonate units may be derived from resorcinol and bisphenol-A in a molar ratio of resorcinol carbonate units to bisphenol-A carbonate units of 1:99 to 99:1.

The photoactive additives of the present disclosure can be a compound, an oligomer, or a polymer. The oligomer has a weight average molecular weight (Mw) of less than 15,000, including 10,000 or less. The polymeric photoactive additives of the present disclosure have a Mw of 15,000 or higher. In particular embodiments, the Mw is between 17,000 and 80,000 Daltons, or between 17,000 and 35,000 Daltons. These molecular weights are measured prior to any UV exposure. The Mw may be varied as desired. Polymers/oligomers with relatively higher Mw's generally retain their mechanical properties better, while polymers/oligomers with relatively lower Mw's generally have better flow properties. In some particular embodiments, the Mw of the photoactive additives is about 5,000 or less. During melt processing, such oligomers are more likely to rise to the surface of the product. Long chain aliphatic diols ($C_6$ or higher) can also be used for this purpose. This may increase the concentration of the additive at the surface, and thus increase the crosslinking density at the surface upon exposure to UV light as well.

One example of a photoactive additive formed from a benzophenone having one substituent with a carboxylate linking group is shown in FIG. 1. Here, (4-benzoylphenoxy)acetic acid (4-BPAA, benzophenone) is reacted with ethylene glycol (first linker moiety) and phosgene (difunctional chain extender) to obtain the photoactive additive. The resulting photoactive additive (PAA) may be an oligomer or a polymer with a weight average molecular weight and a polydispersity index, and contains both ester and carbonate linkages.

Figure 2:
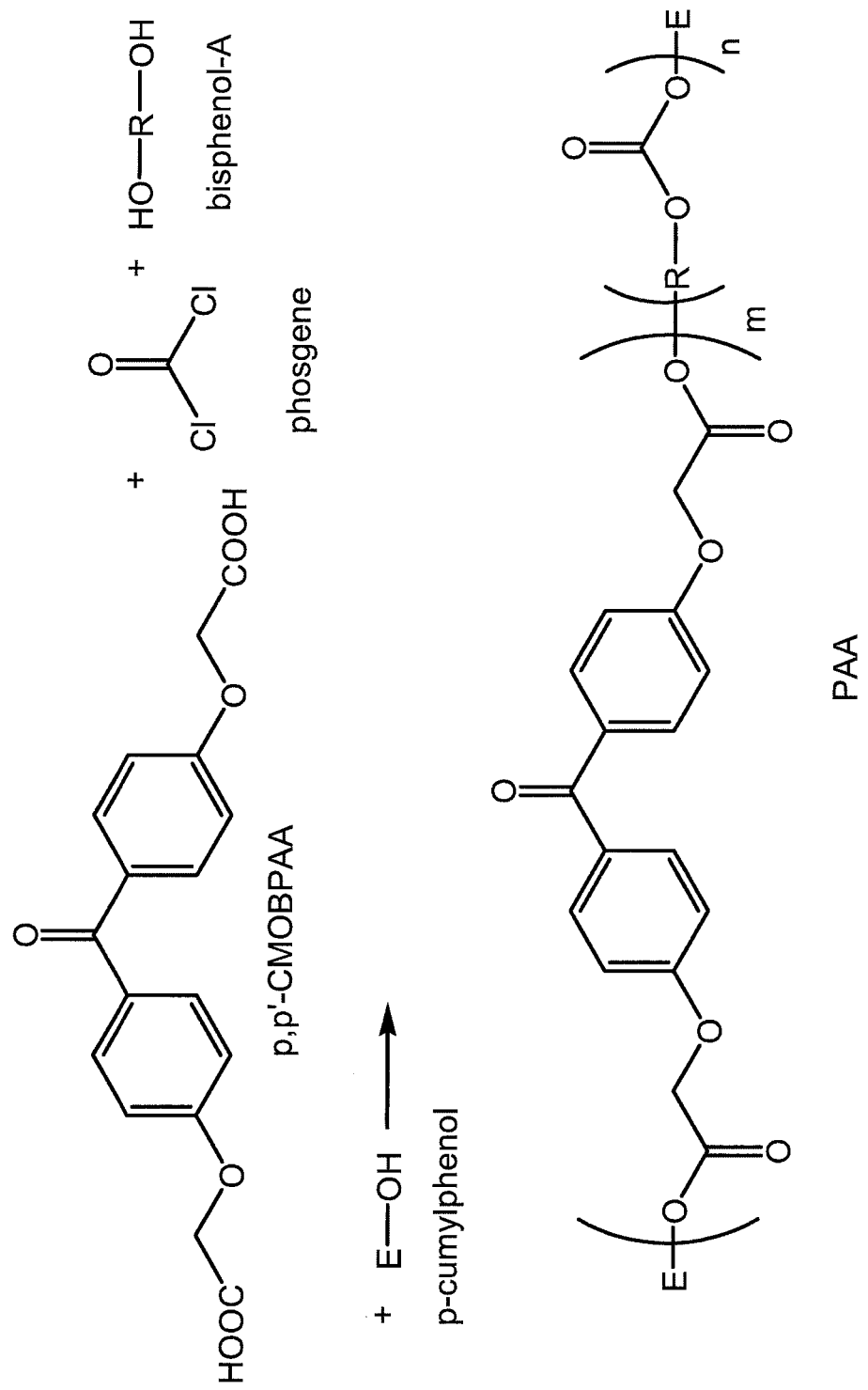
FIG. 2 illustrates the reaction of a benzophenone with two carboxylate linking groups, a first linker moiety, a difunctional chain extender, and an end-capping agent to form the photoactive additive (oligomer/polymer).

An example of a photoactive additive formed from a benzophenone having two substituents with a carboxylate linking group is shown in FIG. 2. Here, p,p'-CMOBPAA (Formula (2-a), benzophenone) is reacted with bisphenol-A (first linker moiety, abbreviated HO—R—OH), phosgene (difunctional chain extender), and p-cumylphenol (end-capping agent, abbreviated HO-E) to obtain the photoactive additive. It should be noted that the benzophenone can only react with the bisphenol-A, the bisphenol-A can react with either the benzophenone or the phosgene, and the phosgene can only react with the bisphenol-A. Thus, the two hydroxyl groups of a given bisphenol-A molecule can participate in either two carbonate linkages, two ester linkages, or one of each linkage. This figure is not intended to show all possible linkages that occur in the resin. The resulting photoactive additive (PAA) may be an oligomer or a polymer with a weight average molecular weight and a polydispersity index, and contains both ester and carbonate linkages.

Figure 3:
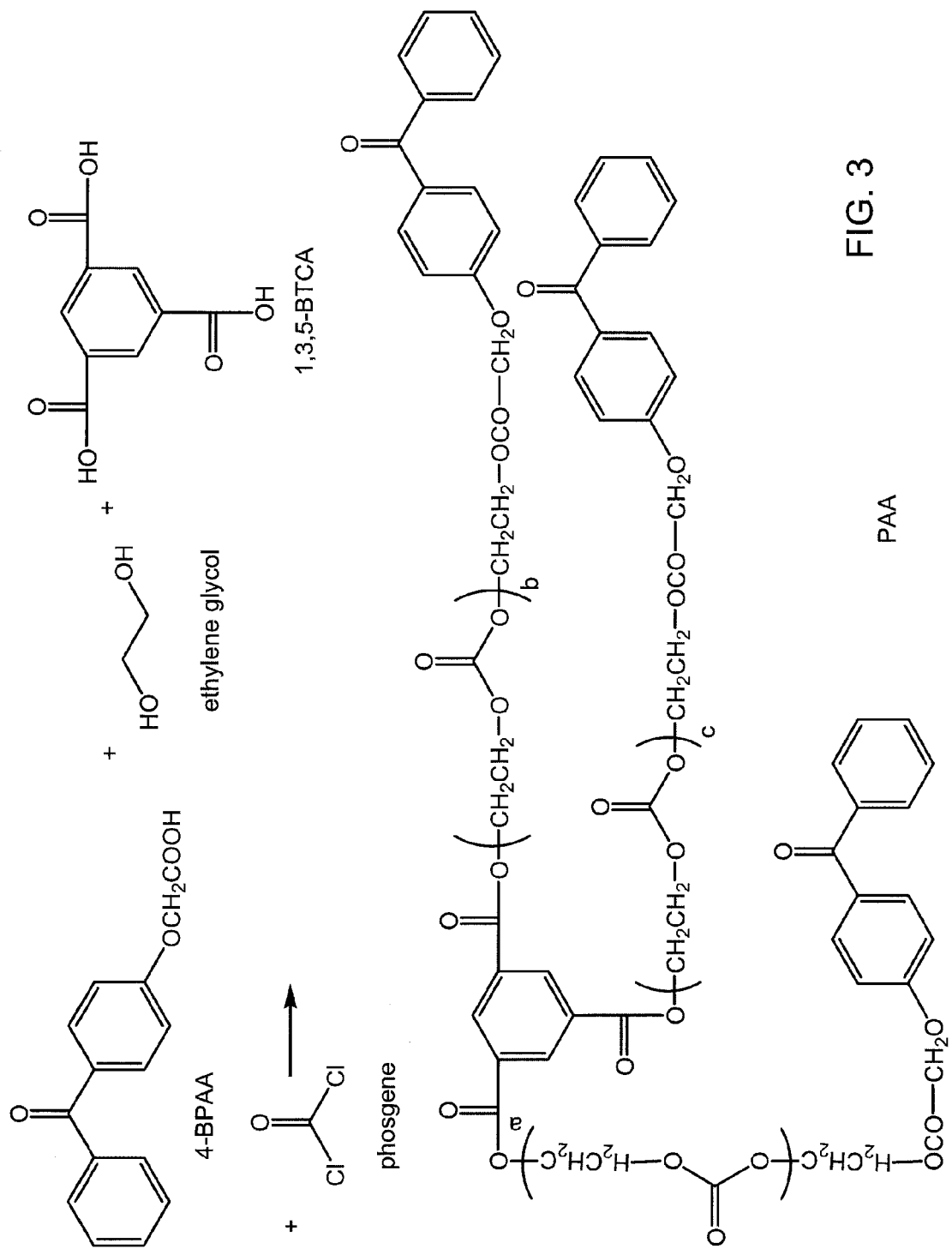
FIG. 3 illustrates the reaction of a benzophenone with one carboxylate linking group, a first linker moiety, a secondary linker moiety, and a difunctional chain extender to form the photoactive additive (oligomer/polymer).

An example of a photoactive additive formed from a benzophenone, a first linker moiety, and a secondary linker moiety is seen in FIG. 3. Here, (4-benzoylphenoxy)acetic acid (4-BPAA, benzophenone) is reacted with ethylene glycol (first linker moiety), phosgene (difunctional chain extender), and 1,3,5-benzenetricarboxylic acid (1,3,5-BTCA, secondary linker moiety) to obtain the photoactive additive. The resulting photoactive additive (PAA) may be an oligomer or a polymer with a weight average molecular weight and a polydispersity index, and contains both ester and carbonate linkages, and is branched.

Figure 4:
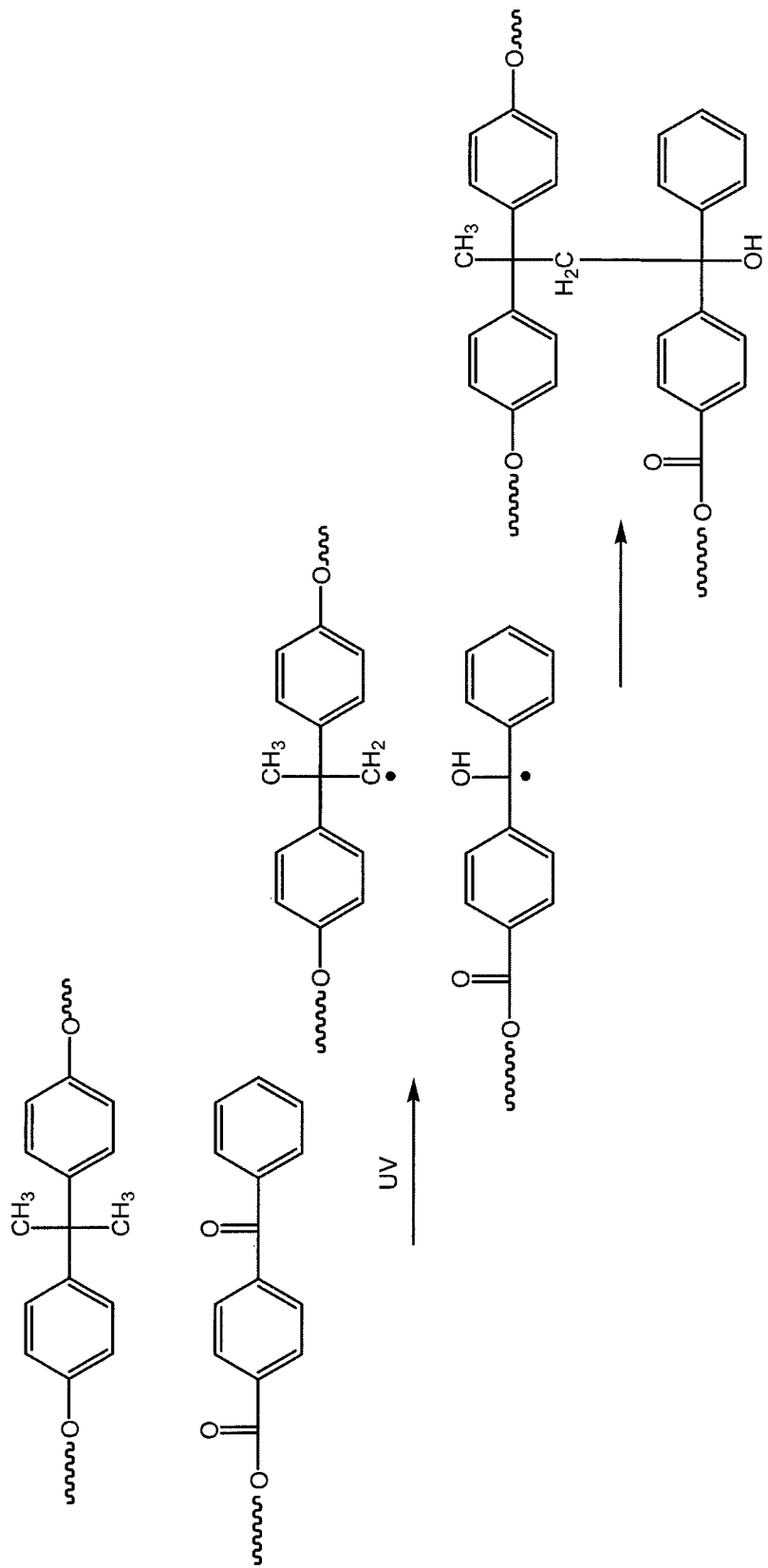
FIG. 4 illustrates the crosslinking mechanism of the photoactive additive.

One crosslinking mechanism of the additives is believed to be due to hydrogen abstraction by the ketone group from an alkyl group that acts as a hydrogen donor and subsequent coupling of the resulting radicals. This mechanism is illustrated in FIG. 4 with reference to the benzophenone (the photoactive moiety) and a bisphenol-A (BPA) monomer. Upon exposure to UV, the oxygen atom of the benzophenone abstracts a hydrogen atom from a methyl group on the BPA monomer and becomes a hydroxyl group. The methylene group then forms a covalent bond with the carbon of the ketone group. Put another way, the ketone group of the benzophenone could be considered to be a photoactive group. It should be noted that the presence of an abstractable hydrogen is critical for this reaction to occur. Other mechanisms may occur after the initial abstraction event with base resins containing unsaturated bonds or reactive side groups.

In particular embodiments, the photoactive additives (PAAs) disclosed herein are cross-linkable polycarbonates. These polycarbonates, prior to cross-linking, can be provided as thermally stable high melt-flow polymers, and can thus be used to fabricate a variety of thin-walled products (e.g., 3 mm or less). These products may subsequently be treated (e.g., with UV-radiation) to affect cross-linking, thereby providing thin-walled materials that meet desired performance requirements (e.g., 5VA performance, chemical resistance, transparency). The cross-linked materials, in addition to flame resistance and chemical resistance, may retain or exhibit superior mechanical properties (e.g., impact resistance, ductility) as compared to the composition prior to cross-linking.

The cross-linkable polycarbonates of the present disclosure include homopolycarbonates, copolymers comprising different moieties in the carbonate (referred as "copolycarbonates"), copolymers comprising carbonate units and other types of polymer units such as polyester units, polysiloxane units, and combinations comprising at least one homopolycarbonate and copolycarbonate. For reference, the term "dipolymer" refers to copolymers derived specifically from two different monomers, and the term "terpolymer" refers to copolymers derived specifically from three different monomers. In particular embodiments, the cross-linkable polycarbonate resin contains from about 0.5 mol % to 50 mole % of the benzophenone, and from about 50 mol % to 99.5 mole % of bisphenol-A. In other particular embodiments, the cross-linkable polycarbonate resin contains from about 0.5 mol % to 25 mole % of the benzophenone, and from about 75 mol % to 99.5 mole % of bisphenol-A.

If the cross-linkable polycarbonate is a copolymer, the monomers may be randomly incorporated into the polycarbonate. A random copolymer may have several block sequences and alternate sequences that follow a statistical distribution. In a random x:(1−x) copolymer, wherein x is the mole percent of a first monomer and 1−x is the mole percent of the other monomers, one can calculate the distribution of each monomer using peak area values determined by $^{13}C$ NMR, for example. The copolymer can be an alternating copolymer with alternating I and O units (-I-O-I-O-I-O-I-O-), or I and O units arranged in a repeating sequence (e.g. a periodic copolymer having the formula: (I-O-I-O-O-I-I-I-I-O-O-O)n). The cross-linkable polycarbonate copolymer may be a statistical copolymer in which the sequence of monomer residues follows a statistical rule. The copolymer may also be a block copolymer that comprises two or more homopolymer subunits linked by covalent bonds (-I-I-I-I-I-O-O-O-O-O-). The union of the homopolymer subunits may require an intermediate non-repeating subunit, known as a junction block. Block copolymers with two or three distinct blocks are called diblock copolymers and triblock copolymers, respectively.

The cross-linkable polycarbonates of the present disclosure may have a weight average molecular weight (Mw) of 15,000 to about 80,000 Daltons [±1,000 Daltons], or of 15,000 to about 35,000 Daltons [±1,000 Daltons], or of about 20,000 to about 30,000 Daltons [±1,000 Daltons]. In certain embodiments, the cross-linkable polycarbonates have weight average molecular weights of about 16,000 Daltons [±1,000 Daltons], about 17,000 Daltons [±1,000 Daltons], about 18,000 Daltons [±1,000 Daltons], about 19,000 Daltons [±1,000 Daltons], about 20,000 Daltons [±1,000 Daltons], about 21,000 Daltons [±1,000 Daltons], about 22,000 Daltons [±1,000 Daltons], about 23,000 Daltons [±1,000 Daltons], about 24,000 Daltons [±1,000 Daltons], about 25,000 Daltons [±1,000 Daltons], about 26,000 Daltons [±1,000 Daltons], about 27,000 Daltons [±1,000 Daltons], about 28,000 Daltons [±1,000 Daltons], about 29,000 Daltons [±1,000 Daltons], about 30,000 Daltons [±1,000 Daltons], about 31,000 Daltons [±1,000 Daltons], about 32,000 Daltons [±1,000 Daltons], about 33,000 Daltons [±1,000 Daltons], about 34,000 Daltons [±1,000 Daltons], or about 35,000 Daltons [±1,000 Daltons]. In additional embodiments, the cross-linkable polycarbonates have a Mw of 17,000 to about 80,000 Daltons. Molecular weight determinations may be performed using gel permeation chromatography (GPC), using a cross-linked styrene-divinylbenzene column and calibrated to polycarbonate references using a UV-VIS detector set at 264 nm, or alternatively using a refractive index detector. Samples may be prepared at a concentration of about 1 mg/ml, and eluted at a flow rate of about 1.0 ml/min.

The cross-linkable polycarbonates of the present disclosure may have a polydispersity index (PDI) of about 2.0 to about 5.0, about 2.0 to about 3.0, or about 2.0 to about 2.5. The PDI is measured prior to any UV exposure.

The cross-linkable polycarbonates of the present disclosure may have a melt flow rate (often abbreviated MFR), which measures the rate of extrusion of a composition through an orifice at a prescribed temperature and load. In certain embodiments, the polycarbonates may have an MFR of 6 to 15 grams/10 min, 6 to 8 grams/10 min, 6 to 12 grams/10 min, 2 to 30 grams/10 min, 5 to 30 grams/10 min, 8 to 12 grams/10 min, 8 to 10 grams/10 min, or 20 to 30 grams/10 min using the ASTM D1238 method, 1.2 kg load, 300° C. temperature, 360 second dwell.

Particular combinations of ingredients are contemplated, and are now described here.

In some embodiments, the photoactive additive is a cross-linkable polycarbonate resin that is prepared by reacting a benzophenone with one substituent, a first linker moiety, and a difunctional chain extender. In such embodiments, the resin may contain about 0.5 mole % to about 5.0 mole % endcap groups derived from the benzophenone. More specifically, the resin is formed by the reaction of (4-benzoylphenoxy) acetic acid (4-BPAA), bisphenol-A, and phosgene. Branched resins can be obtained by using another first linker moiety having at least three functional groups, or by using a secondary linker moiety.

In other embodiments, the photoactive additive is a cross-linkable polycarbonate resin that is prepared by reacting a benzophenone with two substituents, a first linker moiety, and a difunctional chain extender. In these embodiments, the resin may contain from about 0.5 mole % to about 50 mole % of the benzophenone. In more specific embodiments, the polymers contain from about 1 mole % to about 3 mole %, or from about 1 mole % to about 6 mole %, from about 10 mole % to about 25 mole %, or from about 0.5 mole % to about 25 mole % of the benzophenone. An end-capping agent may also be reacted. In more specific embodiments, the resin is formed by the reaction of p,p'-CMOBPAA (Formula (2-a)), bisphenol-A, phosgene, and an end-capping agent. Branched resins can be obtained by using another first linker moiety having at least three functional groups, or by using a secondary linker moiety.

Processes

The photoactive additives (PAA) can be prepared by suitable methods, in particular interfacial polymerization for oligomers and polymers. It may be advantageous to pre-react the linking groups of the hydroxyl-containing moieties with phosgene to form chloroformates. The chloroformates can then be condensed with the other reactants with the aid of a condensation catalyst, such as triethylamine. This can result in a substantially pure product. Alternatively, a mixture of additives can be obtained by mixing all of the reactants together upfront and then reacting.

Blend with Second Polymer Resin

The photoactive additives described above are blended with a polymeric base resin that is different from the photoactive additive, i.e. a second polymer resin, to form the blends of the present disclosure. More specifically, the second polymer resin does not contain photoactive groups. In embodiments, the weight ratio of the photoactive additive to the polymeric base resin is from 1:99 to 99:1, including from about 50:50 to about 85:15, or from about 10:90 to about 15:85, or from about 25:75 to about 50:50. The polymeric base resin has, in specific embodiments, a weight-average molecular weight of about 21,000 or greater, including from about 21,000 to about 40,000.

The blends may be subjected to cross-linking conditions (e.g., UV-radiation) to affect cross-linking of the photoactive additives in the blend. Accordingly, blend compositions of the present disclosure include blends prior to and after cross-linking.

The blends may comprise one or more distinct cross-linkable polycarbonates, as described herein, and/or one or more cross-linked polycarbonates, as described herein, as the photoactive additive. The blends also comprise one or more additional polymers. The blends may comprise additional components, such as one or more additives. In certain embodiments, a blend comprises a cross-linkable and/or cross-linked polycarbonate (Polymer A) and a second polymer (Polymer B), and optionally one or more additives. In another embodiment, a blend comprises a combination of a cross-linkable and/or cross-linked polycarbonate (Polymer A); and a second polycarbonate (Polymer B), wherein the second polycarbonate is different from the first polycarbonate.

In a preferred embodiment, the blend compositions disclosed herein comprise a flame-retardant, a flame retardant additive, and/or an impact modifier. The flame-retardant may be potassium perfluorobutane sulfonate (Rimar salt), potassium diphenyl sulfone-3-sulfonate (KSS), or a combination thereof.

The second polymer (Polymer B) may be any polymer different from the first polymer that is suitable for use in a blend composition. In certain embodiments, the second polymer may be a polyester, a polyestercarbonate, a bisphenol-A homopolymer, a polycarbonate copolymer, a tetrabromo-bisphenol A polycarbonate copolymer, a polysiloxane-co-bisphenol-A polycarbonate, a polyesteramide, a polyimide, a polyetherimide, a polyamideimide, a polyether, a polyethersulfone, a polyepoxide, a polylactide, a polylactic acid (PLA), or any combination thereof.

In certain embodiments, the second polymer may be a vinyl polymer, a rubber-modified graft copolymer, an acrylic polymer, polyacrylonitrile, a polystyrene, a polyolefin, a polyester, a polyesteramide, a polysiloxane, a polyurethane, a polyamide, a polyamideimide, a polysulfone, a polyepoxide, a polyether, a polyimide, a polyetherimide, a polyphenylene ether, a polyphenylene sulfide, a polyether ketone, a polyether ether ketone, an acrylonitrile-butadiene-styrene (ABS) resin, an acrylic-styrene-acrylonitrile (ASA) resin, a polyethersulfone, a polyphenylsulfone, a poly(alkenylaromatic) polymer, a polybutadiene, a polyacetal, a polycarbonate, a polyphenylene ether, an ethylene-vinyl acetate copolymer, a polyvinyl acetate, a liquid crystal polymer, an ethylene-tetrafluoroethylene copolymer, an aromatic polyester, a polyvinyl fluoride, a polyvinylidene fluoride, a polyvinylidene chloride, tetrafluoroethylene, a polylactide, a polylactic acid (PLA), a polycarbonate-polyorganosiloxane block copolymer, or a copolymer comprising: (i) an aromatic ester, (ii) an estercarbonate, and (iii) carbonate repeat units. The blend composition may comprise additional polymers (e.g. a third, fourth, fifth, sixth, etc., polymer).

In certain embodiments, the second polymer may be a homopolycarbonate, a copolycarbonate, a polycarbonate-polysiloxane copolymer, a polyester-polycarbonate, or any combination thereof. In certain embodiments, the second polycarbonate is a p-cumyl phenol capped poly(isophthalate-terephthalate-resorcinol ester)-co-(bisphenol-A carbonate) copolymer. In certain embodiments, the second polycarbonate is a polycarbonate-polysiloxane copolymer.

The p-cumyl phenol capped poly(isophthalate-terephthalate-resorcinol ester)-co-(bisphenol-A carbonate) polymer or a polycarbonate-polysiloxane copolymer may have a polysiloxane content from 0.4 wt % to 25 wt %. In one preferred embodiment, the second polymer is a p-cumylphenol capped poly (19 mol % isophthalate-terephthalate-resorcinol ester)-co-(75 mol % bisphenol-A carbonate)-co-(6 mol % resorcinol carbonate) copolymer (MW=29,000 Daltons). In another preferred embodiment, the second polymer is a p-cumylphenol capped poly(10 wt % isophthalate-terephthalate-resorcinol ester)-co-(87 wt % bisphenol-A carbonate)-co-(3 mol % resorcinol carbonate) copolymer (MW=29,000 Daltons).

In another preferred embodiment, the second polymer is a polycarbonate polysiloxane copolymer. The polycarbonate-polysiloxane copolymer may be a siloxane block co-polycarbonate comprising from about 6 wt % siloxane (±10%) to about 20 wt % siloxane (±10%), and having a siloxane chain length of 10 to 200. In another preferred embodiment, the second polymer is a PC-siloxane copolymer with 20% siloxane segments by weight. In another preferred embodiment, the second polymer is a p-cumylphenol capped poly (65 mol % BPA carbonate)-co-(35 mol % 3,3-bis(4-hydroxyphenyl)-2-phenylisoindolin-1-one (PPPBP) carbonate) copolymer (MW=25,000 Daltons).

In another preferred embodiment, the second polymer is a polyphosphonate polymer, a polyphosphonate copolymer, or a poly(polyphosphonate)-co-(BPA carbonate) copolymer.

In yet other embodiments, the polymer resin in the blend is selected from the group consisting of a polycarbonate-polysiloxane copolymer; a polycarbonate resin having an aliphatic chain containing at least two carbon atoms as a repeating unit in the polymer backbone; a copolyester polymer; a bisphenol-A homopolymer; a polystyrene polymer; a poly (methyl methacrylate) polymer; a thermoplastic polyester; a polybutylene terephthalate polymer; a methyl methacrylate-butadiene-styrene copolymer; an acrylonitrile-butadiene-styrene copolymer; a dimethyl bisphenol cyclohexane-co-bisphenol-A copolymer; a polyetherimide; a polyethersulfone; and a copolycarbonate of bisphenol-A and 1,1-bis(4-hydroxyphenyl)-3,3,5-trimethylcyclohexane) (BPTMC).

In particular embodiments, the polymer resin in the blend is a polycarbonate-polysiloxane (PC-Si) copolymer. The polycarbonate units of the copolymer are derived from dihydroxy compounds having the structures of any of the formulas described above, but particularly those of the chain extenders of Formulas (B) and (C) when Z is hydroxyl. Some illustrative examples of suitable dihydroxy compounds include the following: 1,1-bis(4-hydroxyphenyl)methane, 1,1-bis(4-hydroxyphenyl)ethane, 2,2-bis(4-hydroxyphenyl)propane (hereinafter "bisphenol-A" or "BPA"), 2,2-bis(4-hydroxyphenyl) butane, 2,2-bis(4-hydroxyphenyl)octane, 1,1-bis(4-hydroxyphenyl) propane, 1,1-bis(4-hydroxyphenyl) n-butane, 2,2-bis(4-hydroxy-1-methylphenyl) propane, and 1,1-bis(4-hydroxy-t-butylphenyl)propane; resorcinol, substituted resorcinol compounds such as 5-methyl resorcinol, 5-phenyl resorcinol, or 5-cumyl resorcinol; catechol; hydroquinone; and substituted hydroquinones such as 2-methyl hydroquinone, 2-t-butyl hydroquinone, 2-phenyl hydroquinone, 2-cumyl hydroquinone, or 2,3,5,6-tetramethyl hydroquinone. Bisphenol-A is often part of the PC-Si copolymer.

The polysiloxane blocks of the copolymer can be derived from siloxane-containing dihydroxy monomers. One exemplary siloxane monomer has the structure of Formula (D-1):

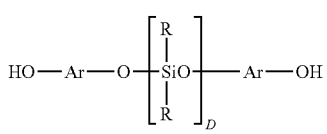

Formula (D-1)

wherein each Ar is independently aryl; each R is independently alkyl, alkoxy, alkenyl, alkenyloxy, aryl, aryloxy, arylalkyl, or alkylaryl; and D is an average value of 2 to about 1000, specifically about 2 to about 500, more specifically about 10 to about 75. Compounds of this formula may be obtained by the reaction of a dihydroxyaromatic compound with, for example, an alpha, omega-bis-acetoxy-polydiorganosiloxane under phase transfer conditions.

Another exemplary siloxane monomer has the structure of Formula (D-3):

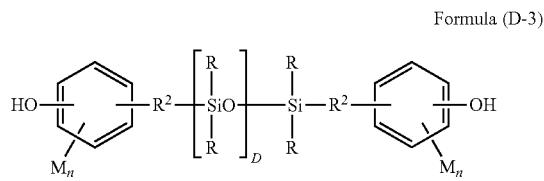

Formula (D-3)

wherein each R is independently alkyl, alkoxy, alkenyl, alkenyloxy, aryl, aryloxy, arylalkyl, or alkylaryl; and D is an average value of 2 to about 1000, specifically about 2 to about 500, more specifically about 10 to about 75; each M is independently cyano, nitro, alkyl, alkoxy, alkenyl, alkenyloxy, aryl, aryloxy, arylalkyl, or alkylaryl; each n is independently an integer from 0 to 4; and each $R_2$ is independently an aliphatic group. Compounds of this formula may be obtained by the reaction of a siloxane hydride with an aliphatically unsaturated monohydric phenol. Suitable aliphatically unsaturated monohydric phenols include, for example, eugenol, 2-alkylphenol, 4-allyl-2-methylphenol, 4-allyl-2-phenylphenol, 4-allyl-2-t-butoxyphenol, 4-phenyl-2-phenylphenol, 2-methyl-4-propylphenol, 2-allyl-4,6-dimethylphenol, 2-allyl-6-methoxy-4-methylphenol and 2-allyl-4,6-dimethylphenol. Mixtures comprising at least one of the foregoing may also be used.

The polymer resin (polymer B) in the blend can be a polycarbonate resin having an aliphatic chain containing at least two carbon atoms as a repeating unit in the polymer backbone. This resin can also be considered a "soft segment polycarbonate" (SSP) resin. Generally speaking, the SSP resin is a copolymer of an aromatic difunctional compound and an aliphatic difunctional compound. The aromatic difunctional compound may have the structure of, for example, any of Formulas (B)-(J), previously described as chain extenders above. In specific embodiments, the aromatic difunctional compound is a bisphenol of Formula (B). The aliphatic difunctional compound provides a long aliphatic chain in the backbone and may have the structure of Formula (E). Exemplary aliphatic diols that are useful in SSP resins include adipic acid (n=4), sebacic acid (n=8), and dodecanedioic acid (n=10).

The SSP resin can be formed, for example by the phosgenation of bisphenol-A, sebacic acid, and p-cumyl phenol. The SSP resin contains carbonate linkages and ester linkages.

In this regard, it is believed that the crosslinking reaction rate of the photoactive additive and its yield are directly related to the hydrogen-to-ketone ratio of the polymeric blend. Thus, the higher the hydrogen-to-ketone ratio of the blend, the higher the rate of chain-extension reaction/crosslinking should be. Due to the presence of the hydrogen-rich SSP resin with its aliphatic blocks, the hydrogen-to-ketone ratio is relatively high. As a result, the crosslinking density and the resulting flame retardance and chemical resistance should be very good for this blend. In addition, the SSP resin has very good flow properties. It is believed that the blend should also have good flow, and should also retain its ductile properties even after crosslinking.

The polymer resin (polymer B) in the blend can be a copolyester polymer or a polybutylene terephthalate (PBT) polymer. Copolyester resins are commercially available, for example under the TRITAN brand from Eastman Chemical Company. PBT resins are commercially available, for example from SABIC Innovative Plastics under the brand name VALOX.

The polymer resin (polymer B) in the blend can be a bisphenol-A homopolymer. Such resins are available, for example as LEXAN from SABIC Innovative Plastics.

The polymer resin (polymer B) in the blend can be a polystyrene polymer. Such polymers contain only polystyrene monomers. Thus, for example ABS and MBS should not be considered polystyrene polymers.

The polymer resin (polymer B) in the blend can be a thermoplastic polyester. An exemplary polyester is PCTG, which is a copolymer derived from the reaction of terephthalic acid, ethylene glycol, and cyclohexanedimethanol (CHDM). The PCTG copolymer can contain 40-90 mole % CHDM, with the terephthalic acid and the ethylene glycol making up the remaining 10-60 mole %.

The polymer resin (polymer B) in the blend can be a dimethyl bisphenol cyclohexane-co-bisphenol-A copolymer, i.e. a DMBPC-BPA copolymer. This copolymer is illustrated below:

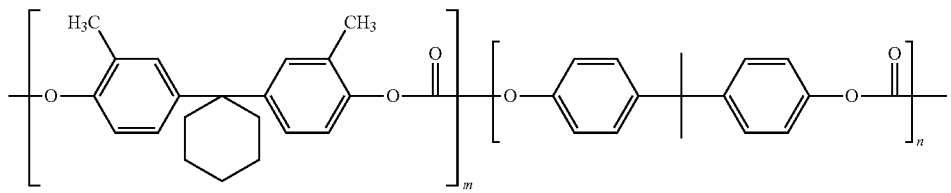

wherein the molar ratio of DMBPC to BPA is m:n. Again, this notation is intended to report the relative molar amounts between the DMBPC units and the BPA units, and should not be construed as denoting the structure of the copolymer (i.e. these two units are randomly distributed and are not blocks). The DMBPC is usually from 20 mole % to 90 mole % of the copolymer, including 25 mole % to 60 mole %. The BPA is usually from 10 mole % to 80 mole % of the copolymer, including 40 mole % to 75 mole %. These resins have high scratch resistance.

Other Additives

Other conventional additives can also be added to the polymeric composition (e.g. an impact modifier, UV stabilizer, colorant, flame retardant, heat stabilizer, plasticizer, lubricant, mold release agent, filler, reinforcing agent, antioxidant agent, antistatic agent, blowing agent, or radiation stabilizer).

In preferred embodiments, the blend compositions disclosed herein comprise a flame-retardant, a flame retardant additive, and/or an impact modifier. The flame-retardant may be potassium perfluorobutane sulfonate (Rimar salt), potassium diphenyl sulfone-3-sulfonate (KSS), or a combination thereof.

Various types of flame retardants can be utilized as additives. In one embodiment, the flame retardant additives include, for example, flame retardant salts such as alkali metal salts of perfluorinated $C_1$-$C_{16}$ alkyl sulfonates such as potassium perfluorobutane sulfonate (Rimar salt), potassium perfluoroctane sulfonate, tetraethylammonium perfluorohexane sulfonate, potassium diphenylsulfone sulfonate (KSS), and the like, sodium benzene sulfonate, sodium toluene sulfonate (NATS) and the like; and salts formed by reacting for example an alkali metal or alkaline earth metal (for example lithium, sodium, potassium, magnesium, calcium and barium salts) and an inorganic acid complex salt, for example, an oxo-anion, such as alkali metal and alkaline-earth metal salts of carbonic acid, such as $Na_2CO_3$, $K_2CO_3$, $MgCO_3$, $CaCO_3$, and $BaCO_3$ or fluoro-anion complex such as $Li_3AlF_6$, $BaSiF_6$, $KBF_4$, $K_3AlF_6$, $KAlF_4$, $K_2SiF_6$, and/or $Na_3AlF_6$ or the like. Rimar salt and KSS and NATS, alone or in combination with other flame retardants, are particularly useful in the compositions disclosed herein. In certain embodiments, the flame retardant does not contain bromine or chlorine.

The flame retardant optionally is a non-halogen based metal salt, e.g., of a monomeric or polymeric aromatic sulfonate or mixture thereof. The metal salt is, for example, an alkali metal or alkali earth metal salt or mixed metal salt. The metals of these groups include sodium, lithium, potassium, rubidium, cesium, beryllium, magnesium, calcium, strontium, francium and barium. Examples of flame retardants include cesium benzenesulfonate and cesium p-toluenesulfonate. See e.g., U.S. Pat. No. 3,933,734, EP 2103654, and US2010/0069543A1, the disclosures of which are incorporated herein by reference in their entirety.

Another useful class of flame retardant is the class of cyclic siloxanes having the general formula $[(R)_2SiO]_y$, wherein R is a monovalent hydrocarbon or fluorinated hydrocarbon having from 1 to 18 carbon atoms and y is a number from 3 to 12. Examples of fluorinated hydrocarbon include, but are not limited to, 3-fluoropropyl, 3,3,3-trifluoropropyl, 5,5,5,4,4,3,3-heptafluoropentyl, fluorophenyl, difluorophenyl and trifluorotolyl. Examples of suitable cyclic siloxanes include, but are not limited to, octamethylcyclotetrasiloxane, 1,2,3,4-tetramethyl-1,2,3,4-tetravinylcyclotetrasiloxane, 1,2,3,4-tetramethyl-1,2,3,4-tetraphenylcyclotetrasiloxane, octaethylcyclotetrasiloxane, octapropylcyclotetrasiloxane, octabutylcyclotetrasiloxane, decamethylcyclopentasiloxane, dodecamethylcyclohexasiloxane, tetradecamethylcycloheptasiloxane, hexadecamethylcyclooctasiloxane, eicosamethylcyclodecasiloxane, octaphenylcyclotetrasiloxane, and the like. A particularly useful cyclic siloxane is octaphenylcyclotetrasiloxane.

Exemplary heat stabilizer additives include, for example, organophosphites such as triphenyl phosphite, tris-(2,6-dimethylphenyl)phosphite, tris-(mixed mono- and di-nonylphenyl)phosphite or the like; phosphonates such as dimethylbenzene phosphonate or the like; phosphates such as trimethyl phosphate, or the like; or combinations comprising at least one of the foregoing heat stabilizers. Heat stabilizers are generally used in amounts of 0.0001 to 1 part by weight, based on 100 parts by weight of the polymer component of the polymeric blend/composition.

Mold release agent (MRA) will allow the material to be removed quickly and effectively. Mold releases can reduce cycle times, defects, and browning of finished product. There is considerable overlap among these types of materials, which may include, for example, phthalic acid esters such as dioctyl-4,5-epoxy-hexahydrophthalate; tris-(octoxycarbonylethyl) isocyanurate; tristearin; di- or polyfunctional aromatic phosphates such as resorcinol tetraphenyl diphosphate (RDP), the bis(diphenyl)phosphate of hydroquinone and the bis(diphenyl)phosphate of bisphenol-A; poly-alpha-olefins; epoxidized soybean oil; silicones, including silicone oils; esters, for example, fatty acid esters such as alkyl stearyl esters, e.g., methyl stearate, stearyl stearate, pentaerythritol tetrastearate (PETS), and the like; combinations of methyl stearate and hydrophilic and hydrophobic nonionic surfactants comprising polyethylene glycol polymers, polypropylene glycol polymers, poly(ethylene glycol-co-propylene glycol) copolymers, or a combination comprising at least one of the foregoing glycol polymers, e.g., methyl stearate and polyethylene-polypropylene glycol copolymer in a suitable solvent; waxes such as beeswax, montan wax, paraffin wax, or the like. Such materials are generally used in amounts of 0.001 to 1 part by weight, specifically 0.01 to 0.75 part by weight, more specifically 0.1 to 0.5 part by weight, based on 100 parts by weight of the polymer component of the polymeric blend/composition.

In particular embodiments, the polymeric blend/composition includes the photoactive additive, an optional polymeric base resin, and a flame retardant which is Rimar salt and which is present in an amount of about 0.05 wt % to about 0.085 wt %, based on the total weight of the composition; and a plaque comprising the polymeric composition has a transparency of 70 to 90% at a thickness of 3.2 mm, measured according to ASTM-D1003-00.

In other particular embodiments, the polymeric blend/composition includes the photoactive additive, an optional polymeric base resin, a flame retardant; a heat stabilizer, and a mold release agent.

The additives, when used, can improve the chemical resistance of the final product. It is contemplated that products can be used in many different applications, for example in the medical, automotive, and consumer electronics fields. Increased chemical resistance may be found against 409 Glass and Surface Cleaner; Alcohol Prep Pad; CaviCide liquid/CaviWipes; CaviWipes; Cidex Plus liquid; Clorox Bleach; Clorox Wipes; Envirocide liquid; For Pro liquid; Gentle dish soap and water; Hydrogen Peroxide Cleaner Disinfectant Wipes; Isopropyl Alcohol wipes; MadaCide-1 liquid; Mar-V-Cide liquid to dilute; Sani-Cloth Bleach Wipes; Sani-Cloth HB Wipes; Sani-Cloth Plus Wipes; Sodium Hypochlorite liquid; Super Sani-Cloth Wipes; Viraguard liquid and Wipes; Virex 256; Windex Blue; Fuel C; Toluene; Heptane; Ethanol; Isopropanol; Windex; Engine oil; WD40; Transmission fluid; brake fluid; Glass wash; Diesel; Gasoline; Banana Boat Sunscreen (SPF 30); Sebum; Ivory Dish Soap; SC Johnson Fantastik Cleaner; French's Yellow Mustard; Coca-Cola; 70% Isopropyl Alcohol; Extra Virgin Olive Oil; Vaseline Intensive Care Hand Lotion; Heinz Ketchup; Kraft Mayonnaise; Chlorox Formula 409 Cleaner; SC Johnson Windex Cleaner with Ammonia; Acetone; Artificial Sweat; Fruits & Passion Cucina Coriander & Olive Hand Cream; Loreal Studioline Megagel Hair Gel; Maybelline Lip Polish; Maybelline Expert Wear Blush—Beach Plum Rouge; Purell Hand Sanitizer; Hot coffee, black; iKlear; Chlorox Wipes; Squalene; Palmitic Acid; Oleic Acid; Palmitoleic Acid; Stearic Acid; and Olive Oil.

Articles

Compositions/blends disclosed herein, preferably prior to cross-linking, may be formed, shaped, molded, injection molded, or extruded into a product, particularly thin-walled products, including highly transparent thin-walled products, having improved flame retardance and good physical properties.

The compositions/blends can be molded into useful shaped products by a variety of means such as injection molding, overmolding, co-injection molding, extrusion, multilayer extrusion, rotational molding, blow molding and thermoforming to form products. The formed products may be subsequently subjected to cross-linking conditions (e.g., UV-radiation) to affect cross-linking of the polycarbonates. Exemplary products include a molded article, a film, a sheet, a layer of a multilayer film, a layer of a multilayer sheet, or portions thereof.

Products that may be formed from the compositions/blends include various components for cell phones and cell phone covers, components for computer housings (e.g. mouse covers), fibers, computer housings and business machine housings and parts such as housings and parts for monitors, computer routers, copiers, desk top printers, large office/industrial printers handheld electronic device housings such as computer or business machine housings, housings for hand-held devices, components for light fixtures or home or office appliances, humidifier housings, thermostat control housings air conditioner drain pans, outdoor cabinets, telecom enclosures and infrastructure, Simple Network Intrusion Detection System (SNIDS) devices, network interface devices, smoke detectors, components and devices in plenum spaces, components for medical applications or devices such as medical scanners, X-ray equipment, and ultrasound devices, components for interior or exterior components of an automobile, lenses (auto and non-auto) such as components for film applications, greenhouse components, sun room components, fire helmets, safety shields, safety goggles, glasses with impact resistance, fendors, gas pumps, films for televisions, such as ecofriendly films having no halogen content, solar application materials, glass lamination materials, fibers for glass-filled systems, hand held electronic device enclosures or parts (e.g. walkie-talkie, scanner, media/MP3/MP4 player, radio, GPS system, ebook, tablet), wearable electronic devices (e.g. smart watch, training/tracking device, activity/sleep monitoring system, wristband, or glasses), hand held tool enclosures or parts, smart phone enclosures or parts, turbine blades (e.g., wind turbines), and the like.

In certain embodiments, products that may comprise the composition/blend include automotive bumpers, other automotive, construction and agricultural equipment exterior components, automobile mirror housings, an automobile grille, an automobile pillar, automobile wheel covers, automobile, construction and agricultural equipment instrument panels and trim, construction and agricultural grilles, automobile glove boxes, automobile door hardware and other interior trim, automobile construction and agricultural equipment exterior lights, automobile parts within the engine compartment, plumbing equipment, valves and pumps, air conditioning heating and cooling parts, furnace and heat pump parts, computer parts, electronics parts, projector parts, electronic display parts, copier parts, scanner parts, electronic printer toner cartridges, hair driers, irons, coffee makers, toasters, washing machines, microwaves, ovens, power tools, electric components, lighting parts, dental instruments and equipment, medical instruments, cookware, medical instrument trays, animal cages, fibers, laser welded medical devices, hand held electronic device enclosures or parts (e.g. walkie-talkie, scanner, media/MP3/MP4 player, radio, GPS system, ebook, tablet), wearable electronic devices (e.g. smart watch, training/tracking device, activity/sleep monitoring system, wristband, or glasses), hand held tool enclosures or parts, smart phone enclosures or parts, and fiber optics.

In certain embodiments, products that may comprise the composition/blend include automotive bumpers, other automotive exterior components, automobile mirror housings, an automobile grille, an automobile pillar, automobile wheel covers, automobile instrument panels and trim, automobile glove boxes, automobile door hardware and other interior trim, external automobile trim parts, such as pillars, automobile exterior lights, automobile parts within the engine compartment, an agricultural tractor or device part, a construction equipment vehicle or device part, a construction or agricultural equipment grille, a marine or personal water craft part, an all terrain vehicle or all terrain vehicle part, plumbing equipment, valves and pumps, air conditioning heating and cooling parts, furnace and heat pump parts, computer parts, electronics parts, projector parts, electronic display parts, copier parts, scanner parts, electronic printer toner cartridges, hair driers, irons, coffee makers, toasters, washing machines, microwaves, ovens, power tools, electric components, electric enclosures, lighting parts, dental instruments, medical instruments, medical or dental lighting parts, an aircraft part, a train or rail part, a seating component, sidewalls, ceiling parts, cookware, medical instrument trays, animal cages, fibers, laser welded medical devices, fiber optics, lenses (auto and non-auto), cell phone parts, greenhouse components, sun room components, fire helmets, safety shields, safety glasses, gas pump parts, hand held electronic device enclosures or parts (e.g. walkie-talkie, scanner, media/MP3/MP4 player, radio, GPS system, ebook, tablet), wearable electronic devices (e.g. smart watch, training/tracking device, activity/sleep monitoring system, wristband, or glasses), hand held tool enclosures or parts, smart phone enclosures or parts, and turbine blades.

In certain embodiments, the product is one that requires or must include a material having a UL94 5VA rating performance. Products that require a UL94 5VA rating include, but are not limited to, computer housings, computer housings and business machine housings and parts such as housings and parts for monitors, computer routers, copiers, desk top printers, large office/industrial printers, handheld electronic device housings such as computer or business machine housings, housings for hand-held devices, components for light fixtures including LED fixtures or home or office appliances, humidifier housings, thermostat control housings, air conditioner drain pans, outdoor cabinets, telecom enclosures and infrastructure, Simple Network Intrusion Detection System (SNIDS) devices, network interface devices, smoke detectors, components and devices in plenum spaces, components for medical applications or devices such as medical scanners, X-ray equipment, and ultrasound devices, electrical boxes and enclosures, and electrical connectors.

In certain embodiments, the product is one that requires hydrothermal stability, such as a wind turbine blade, a steam sterilizable medical device, a food service tray, utensils and equipment.

In certain embodiments, the product is one that requires a combination of transparency, flame resistance, and/or impact resistance. For example, in certain embodiments the product may be a safety shield, safety goggles, a gas/fuel pump housing, a display window or part, or the like.

UV Irradiation

The PAA-containing blend can be formed into a product by a variety of known processes such as solution casting, profile extrusion, film and/or sheet extrusion, sheet-foam extrusion, injection molding, blow molding, thermoforming, and the like. The product, or a portion thereof, is then exposed to ultraviolet (UV) light at an appropriate wavelength and in an appropriate dosage that brings about the desired amount of crosslinking for the given application. Depending on the end use application and the desired properties, the UV exposure can be performed on one or more surfaces of the product.

The product where the enhanced properties are needed should be exposed with a substantially uniform dose of UV light. The exposure can be accomplished using standard methods known in the art. For example, the UV light can come from any source of UV light such as, but not limited to, those lamps powered by microwave, HID lamps, and mercury vapor lamps. In some other embodiments, the product is exposed by using natural sunlight. The exposure time will be dependent on the application and color of material. It can range from a few minutes to several days. Alternatively, the crosslinking can be accomplished by using a UV-emitting light source such as a mercury vapor, High-Intensity Discharge (HID), or various UV lamps. For example, commercial UV lamps are sold for UV curing from manufacturers such as Hereaus Noblelight Fusion UV. Non-limiting examples of UV-emitting light bulbs include mercury bulbs (H bulbs), or metal halide doped mercury bulbs (D bulbs, H+ bulbs, and V bulbs). Other combinations of metal halides to create a UV light source are also contemplated. Exemplary bulbs could also be produced by assembling the lamp out of UV-absorbing materials and considered as a filtered UV source. An undoped mercury arc lamp is not used for irradiation. An H bulb has strong output in the range of 200 nm to 320 nm. The D bulb has strong output in the 320 nm to 400 nm range. The V bulb has strong output in the 400 nm to 420 nm range.

It can be beneficial to control the temperature. Often increased temperature can increase the crosslinking, but if the temperature is excessive the product can become unacceptably discolored, warped, or distorted.

It may also be advantageous to use a UV light source where the harmful wavelengths (those that cause polymer degradation or excessive yellowing) are removed or not present. Equipment suppliers such as Heraeus Noblelight Fusion UV provide lamps with various spectral distributions. The light can also be filtered to remove harmful or unwanted wavelengths of light. This can be done with optical filters that are used to selectively transmit or reject a wavelength or range of wavelengths. These filters are commercially available from a variety of companies such as Edmund Optics or Praezisions Glas & Optik GmbH. Bandpass filters are designed to transmit a portion of the spectrum, while rejecting all other wavelengths. Longpass edge filters are designed to transmit wavelengths greater than the cut-on wavelength of the filter. Shortpass edge filters are used to transmit wavelengths shorter than the cut-off wavelength of the filter. Various types of materials, such as borosilicate glass, can be used as a long pass filter. Schott and/or Praezisions Glas & Optik GmbH for example have the following long pass filters: WG225, WG280, WG295, WG305, WG320 which have cut-on wavelengths of ~225, 280, 295, 305, and 320 nm, respectively. These filters can be used to screen out the harmful short wavelengths while transmitting the appropriate wavelengths for the crosslinking reaction.

UV wavelengths can be separated into four different categories. UVA refers to wavelengths from 320 nm to 390 nm. UVB refers to wavelengths from 280 nm to 320 nm. UVC refers to wavelengths from 250 nm to 260 nm. UW refers to wavelengths from 395 nm to 445 nm. In some embodiments, the UV radiation is filtered to provide no detectable UVC radiation, as measured using an EIT PowerPuck.

In particular embodiments, at least a portion of the product is exposed to a selected UV light range having wavelengths from about 280 nanometers (nm) to about 380 nm, or from about 330 nm to about 380 nm, or from about 280 nm to about 360 nm, or from about 330 nm to about 360 nm. The wavelengths in a "selected" light range have an internal transmittance of greater than 50%, with wavelengths outside of the range having an internal transmittance of less than 50%. The change in transmittance may occur over a range of 20 nm. Reference to a selected light range should not be construed as saying that all wavelengths within the range transmit at 100%, or that all wavelengths outside the range transmit at 0%.

A high quality crosslinked layer in a product is a layer which has the desired crosslinked layer thickness; desired cross-linked density (higher crosslink density may afford better chemical resistance, but may also lead to lower toughness); a lower level of color shift; a lower level of warp and article distortion; and/or a low level of resin degradation from harmful UV radiation. A high quality crosslinked layer and product is achieved by selecting UV light that induces crosslinking while minimizing the UV light wavelengths which induce degradation and color formation of the composition.

The exposed product may have a cross-linked outer surface and an inner surface that is either lightly cross-linked or not cross-linked. The outer surface can be cross-linked to such a degree that the outer surface is substantially insoluble in the common solvents for the starting resins. The percentage of the insolubles (insoluble component) will be dependent on the part geometry and surface-to-volume ratio.

The following examples are provided to illustrate the polymeric compositions/blends, products, processes and properties of the present disclosure. The examples are merely illustrative and are not intended to limit the disclosure to the materials, conditions, or process parameters set forth therein.

EXAMPLE 1

(4-benzoylphenoxy)acetic acid was synthesized according to the following reaction:

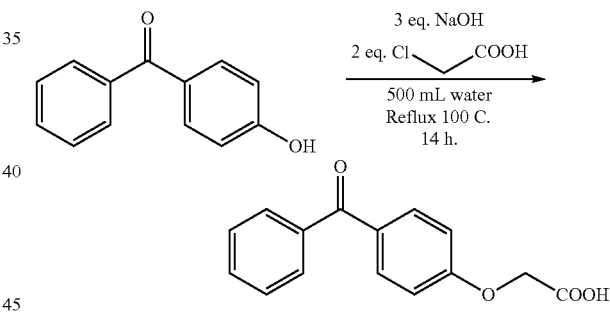

Figure 5:
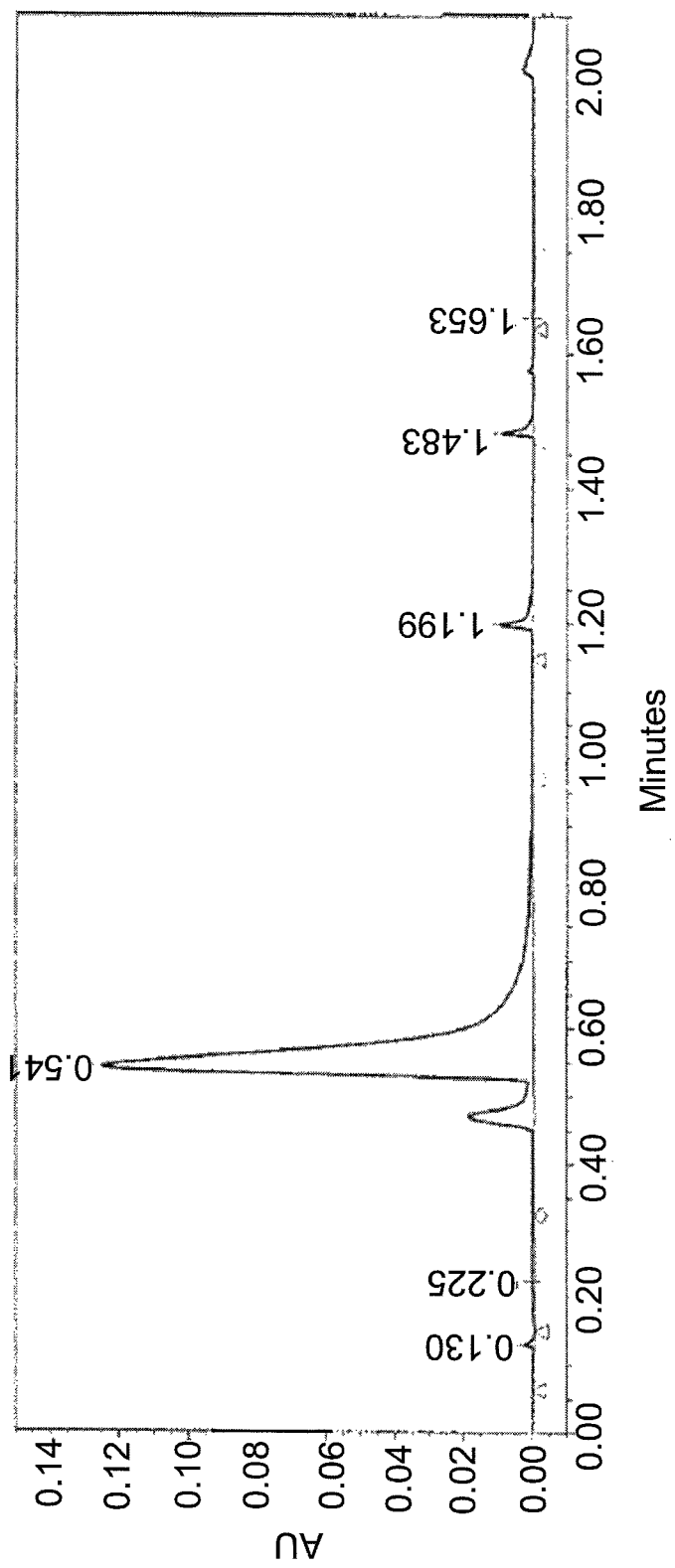
FIG. 5 is the UPLC analysis of the benzophenone compound formed in the example. The y-axis is AU (absorbance units), and the x-axis is minutes. The line has been partially traced for better visibility.

20.5 grams (103.4 mmol) of 4-hydroxybenzophenone were suspended in water and dissolved adding 3 equivalents of NaOH. The solution was heated up to 90° C. A solution of 15 grams of chloroacetic acid (1.6 eq.) in 40 mL of water was added dropwise to the reactor for 30 minutes. After that, the reactor was put on reflux at 100° C. for 14 hours or overnight. After that time the solution was cooled down to room temperature and acidified to pH 1-3. A white precipitate appeared. The solution was filtered and the solid dissolved in acetone. The acetone was filtered again and the acetone was evaporated to dryness. The product thus obtained was significantly contaminated with starting material. After crystallization in chloroform, 12 grams of a >95% (4-benzoylphenoxy) acetic acid was obtained (45% yield). FIG. 5 is the UPLC analysis of the compound after crystallization in CHCl3 at 264 nm, using the PCP_FAST method in a C18 column. This compound was used as an endcapping agent.

Figure 6:
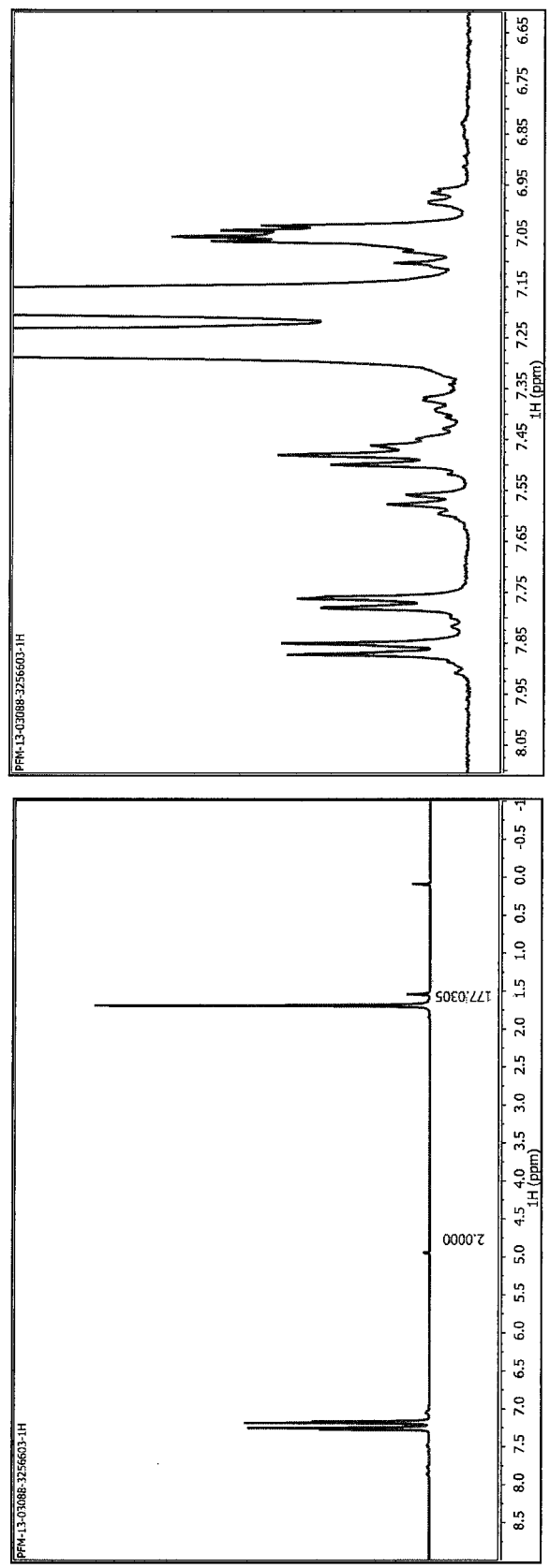
FIG. 6 is two graphs analyzing a polymer formed in the example using the benzophenone.

For interfacial polymerization, 35 grams of bisphenol-A (153 mmol) were suspended in 500 mL of dichloromethane and 300 mL of distilled water. Afterwards, 1.57 g of (4-benzoylphenoxy)acetic acid (4%, 6.1 mmol) and 0.43 mL of triethylamine (2%, 3.1 mmol) were added into the reactor and phosgenated at 2 g/min for 12 minutes and pH at 9.5. The polymer was precipitated and dried. Tg=144.8 C and the incorporation of endcap was complete (3.4%) by NMR. FIG. 6 is two graphs. The left-hand graph shows the analysis by NMR, and the right-hand graph shows the incorporation analysis into the BPA polycarbonate.

Figure 7:
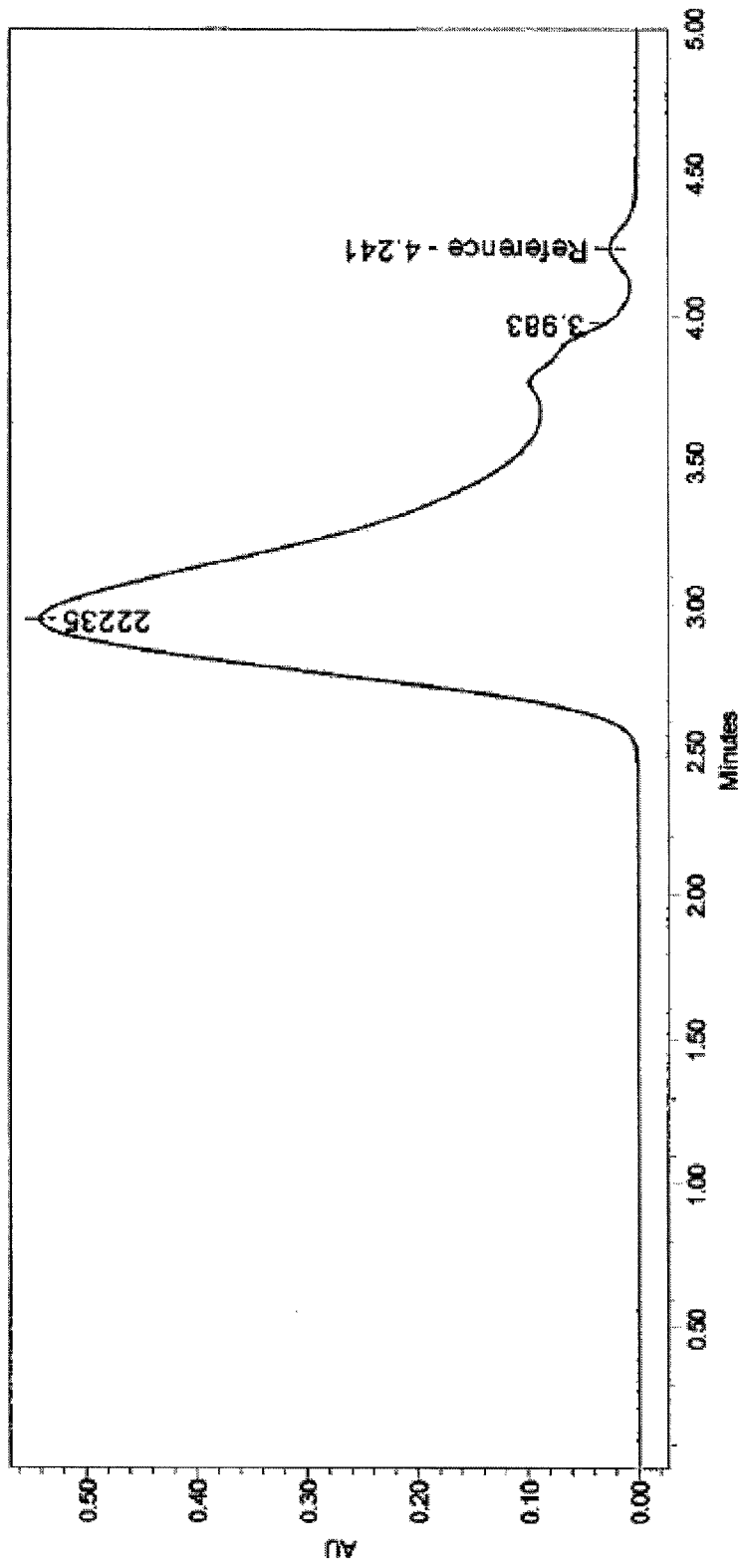
FIG. 7 is a chromatogram of the polymer formed in the example. The y-axis is AU (absorbance units), and the x-axis is minutes. The line has been partially traced for better visibility.

FIG. 7 is the chromatogram of the final polymer. The Mw is about 19,337, and the PDI is 4.14. Some unidentified low molecular weight species were present.

The crosslinking capacity of the new polymer was compared to the cross-linking capacity of 4-hydroxybenzophenone end-capped polycarbonate. A film of 4-hydroxybenzophenone end-capped polycarbonate and a film of (4-benzoylphenoxy)acetic acid end-capped polycarbonate was irradiated using a Fusion UV System 600 W, which used a D-bulb electrodeless bulb. The film thicknesses were equal.

The UV energy (per pass or dose) for the Fusion UV System is provided below in Table A, and was measured using an EIT PowerPuck. The dose was measured as the energy from 320-390 nm (UVA), 280-320 nm (UVB), 250-260 nm (UVC) and 395-445 nm (UVV). The dose was calculated in $J/cm^2$.

TABLE A

| | Fusion (unfiltered light) | | | |
| --- | --- | --- | --- | --- |
| | Fusion UV | | | |
| Unfiltered | UVA $J/cm^2$ | UVB $J/cm^2$ | UVC $J/cm^2$ | UVV $J/cm^2$ |
| 2 passes | 12.0 | 3.7 | 0.45 | 5.8 |
| 6 passes | 35.9 | 11.0 | 1.34 | 17.5 |
| 10 passes | 59.9 | 18.3 | 2.24 | 29.2 |

The irradiated films formed gel at the same dosages. The crosslinking density x was measured by using GPC analysis and the formula shown below (Mw is molecular weight average after irradiation; Mw0 is molecular weight average before irradiation; n is the subunits number before irradiation; x is the crosslinking density):

$$M_w = \frac{M_{w0}}{1 - 2 \cdot n \cdot x}$$

Figure 8:
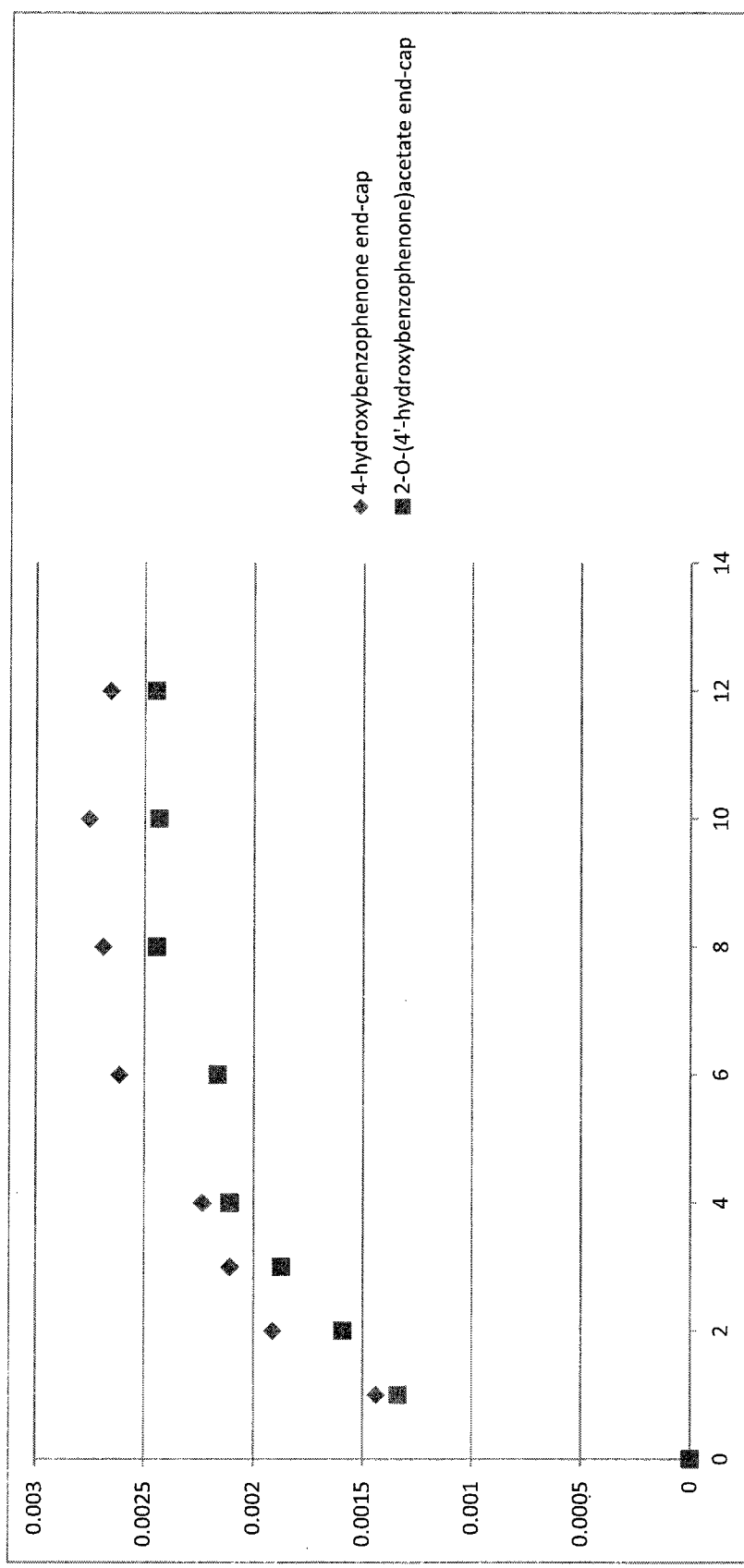
FIG. 8 is a graph comparing the crosslinking density of two polycarbonates, one using a 4-hydroxybenzophenone as the endcapping agent (diamonds), and the other using a carboxyl-substituted benzophenone as the endcapping agent (squares). The density in both polymers is about the same. The y-axis is dimensionless x (the crosslinking density), and the x-axis is number of passes (proxy for quantity of UV exposure).

FIG. 8 is a graph indicating the crosslinking density (x, y-axis) versus the number of passes through a Fusion UV System for both polymers (x-axis, proxy for amount of UV exposure). It has been observed that when x is greater than 0.0013, gel formation is observed. The graph shows that the bisphenol-A polycarbonate having a benzophenone endcap through a terminal ester linkage is capable of crosslinking on the surface of the polycarbonate to the same extent as a bisphenol-A polycarbonate having a benzophenone endcap through a terminal carbonate linkage.

EXAMPLE 2

The compound 2-[4-[4-(carboxymethoxy)benzoyl]-phenoxy]acetic acid (4,4'-diacetate-HBP) was synthesized according to the following two-step reaction.

First, ethyl 2-[4-[4-(2-ethoxy-2-oxoethoxy)benzoyl]phenoxy]acetate was synthesized.

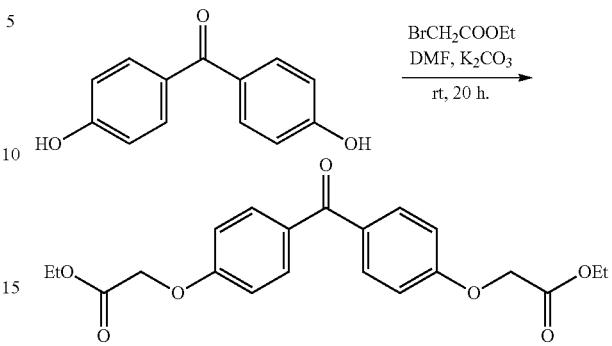

In a 500 mL round bottom flask, 12.5 grams (58.4 mmol) of 4,4'-dihydroxybenzophenone were dissolved in 240 mL of DMF. After dissolution, $K_2CO_3$ (24.2 grams, 2.5 equivalents) was added and stirred at room temperature. The solution turned slightly yellow. After addition of $K_2CO_3$, 14.2 mL of ethyl 2-bromoacetate (21.4 grams, 2.2 equivalents) was added to the solution and stirred overnight for 20 hours.

After overnight, 200 mL of ethyl acetate (AcOEt) and 600 mL of distilled H2O was added. The crude product was extracted with 3×200 mL of AcOEt. The organic phases were joined together and extracted with 4×200 mL of distilled water and 2×150 mL of Brine (NaCl saturated solution in water). The organic phase was dried under $MgSO_4$, filtered and evaporated. The product was purified by crystallization with AcOEt/Hexane. 18 grams of product (88% yield) was obtained as white crystals.

Second, the ethoxy groups in the product were converted to hydroxyl groups to obtain the diacetate-HBP.

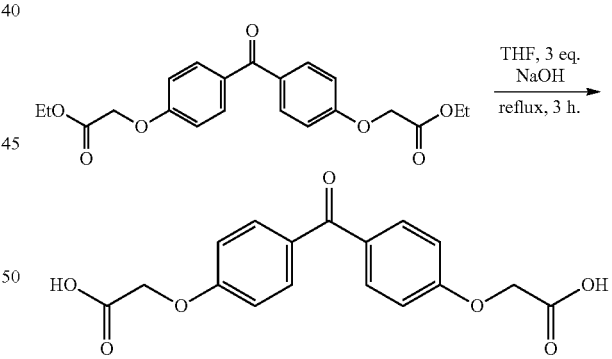

In a 100 mL round bottom flask, 13.5 grams of starting material (34.9 mmol) were dissolved in 40 mL of tetrahydrofuran. To the solution, 20 mL of 30% NaOH aqueous solution (3 equivalents) were added and refluxed for 3 hours. During the reflux, the solution turned milky white. After complete consumption of starting material by UPLC, the solution was cooled down, acidified to pH 1 with HCl, and filtered. The precipitate was washed with acidified water with HCl (pH 1) and washed once with distilled water. The precipitate was dried in the oven (70° C. for 12 hours). 8 grams of a white powder (69% yield) with a melting point of 234.10° C. (DSC) was obtained.

EXAMPLE 3

The p,p'-CMOBPAA (corresponding to Formula (2-a)) was polymerized with bisphenol-A (BPA), p-cumylphenol (PCP), and phosgene to obtain a polycarbonate copolymer.

35 grams of BPA, 5 grams of the p,p'-CMOBPAA, and 1.43 grams of PCP were suspended in a mixture of dichloromethane (500 mL) and water (300 mL). 0.6 mL of methyl tributylammonium chloride (MTBA, phase transfer agent) and 0.43 mL of triethylamine (TEA) were added. Phosgene was bubbled in two steps: 1 g/min at pH 6 for 7 minutes and 1 g/min at pH 9.5 for 18 minutes. After that, the solution was acidified with HCl and washed three times with distilled water. The copolymer was precipitated in hot water and dried. Mw=21000 (PDI 4.11). According to NMR, the p,p'-CMOBPAA was 7.8 mole % of the copolymer. The Tg of the polycarbonate copolymer was 142.86° C.

A film was made by pouring a solution of the PC onto a piece of glass and letting the solvent evaporate. The film had an irregular thickness of approximately 60-70 micrometers. The film was then irradiated for 12 minutes using a Loctite Zeta 7411-S system, which used a 400 W metal halide arc lamp with a spectral output similar to a D-bulb containing a 280-nm cut-on wavelength. The UV energy (per pass or dose) for this system is provided below in Table B, and was measured using an EIT PowerPuck. The dose was measured as the energy from 320-390 nm (UVA), 280-320 nm (UVB), 250-260 nm (UVC) and 395-445 nm (UVV). The dose was calculated in J/cm².

TABLE B

| | Loctite (filtered light). | | | |
|---|---|---|---|---|
| | Loctite Dose | | | |
| Filtered | UVA J/cm² | UVB J/cm² | UVC J/cm² | UVV J/cm² |
| 320 sec exposure | 12.0 | 2.4 | 0 | 7.3 |
| 960 sec | 36.0 | 7.2 | 0 | 21.9 |
| 1600 sec | 60.2 | 12.1 | 0 | 36.6 |

Prior to irradiation, the Mw of the copolymer was 21,113. After irradiation, a gel was formed, and the measured Mw was 30,841. The formation of gel and the increased molecular weight are indicators that crosslinking occurred.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A photoactive additive formed from the reaction of:
   (i) a benzophenone having the structure of Formula (1), (2), or (3):

Formula (1)
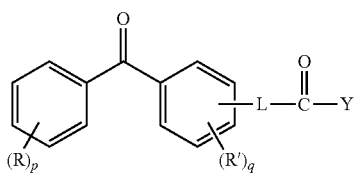

Formula (2)
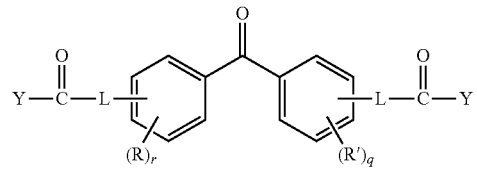

Formula (3)
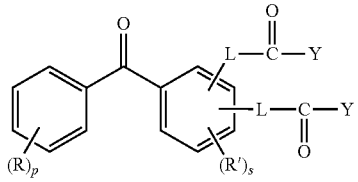

wherein R and R' are independently alkyl, aryl, alkenyl, halogen, sulfonate, phosphate, phosphonate, nitrile, thiophene, or pyrrole; p is an integer from 0 to 5; q and r are independently an integer from 0 to 4; s is an integer from 0 to 3; L is oxyalkylene; and Y is hydroxyl, alkoxy, aryloxy, or halogen; or an anhydride thereof; and (ii) a first linker moiety comprising a plurality of functional groups and having the structure of one of the following Formulas (B)-(I):

Formula (B)
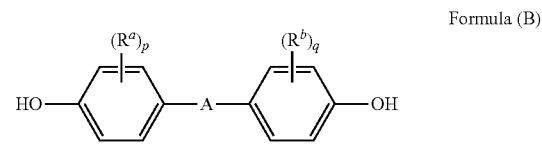

wherein $R^a$ and $R^b$ each represent a halogen atom or a monovalent hydrocarbon group and may be the same or different; p and q are each independently integers of 0 to 4; and A represents one of the groups of formula (B-1):

(B-1)
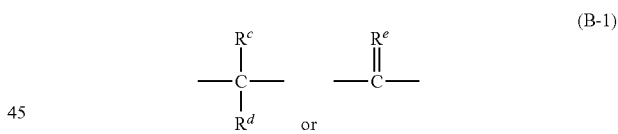

wherein $R^c$ and $R^d$ each independently represent a hydrogen atom or a monovalent linear or cyclic hydrocarbon group and $R^e$ is a divalent hydrocarbon group;

Formula (C)
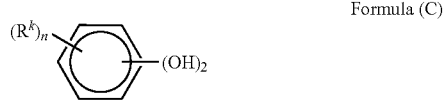

wherein each $R^k$ is independently a $C_{1-10}$ hydrocarbon group, and n is 0 to 4;

Formula (D-1)
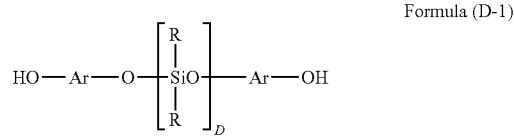

-continued

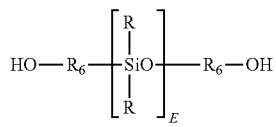

Formula (D-2)

wherein each Ar is independently aryl; each R is independently alkyl, alkoxy, alkenyl, alkenyloxy, aryl, aryloxy, arylalkyl, or alkylaryl; each $R_6$ is independently a divalent $C_1$-$C_{30}$ organic group such as a $C_1$-$C_{30}$ alkyl, $C_1$-$C_{30}$ aryl, or $C_1$-$C_{30}$ alkylaryl; and D and E are an average value of 2 to about 1000;

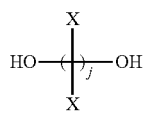

Formula (E)

wherein each X is independently hydrogen, halogen, or alkyl; and i is an integer from 1 to 20;

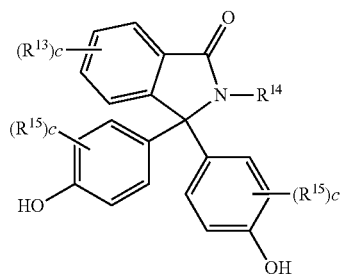

(F)

wherein $R^{13}$ and $R^{15}$ are each independently a halogen or a $C_1$-$C_6$ alkyl group, $R^{14}$ is a $C_1$-$C_6$ alkyl, phenyl, or phenyl substituted with up to five halogens or $C_1$-$C_6$ alkyl groups, and c is 0 to 4;

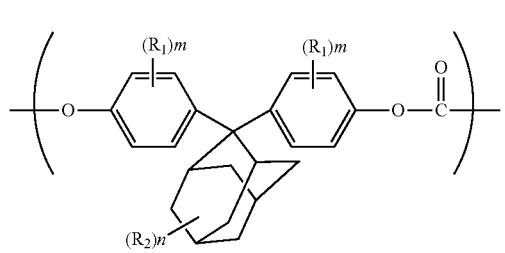

(G)

wherein $R_1$ represents a halogen atom, an alkyl group having 1 to 6 carbon atoms, an alkoxy group having 1 to 6 carbon atoms, an aryl group having 6 to 12 carbon atoms, an aryl-substituted alkenyl group having 7 to 13 carbon atoms, or a fluoroalkyl group having 1 to 6 carbon atoms; $R_2$ represents a halogen atom, an alkyl group having 1 to 12 carbon atoms, an alkoxy group having 1 to 12 carbon atoms, an aryl group having 6 to 12 carbon atoms, an aryl-substituted alkenyl group having 7 to 13 carbon atoms, or a fluoroalkyl group having 1 to 12 carbon atoms; m represents an integer of 0 to 4; and n represents an integer of 0 to 14;

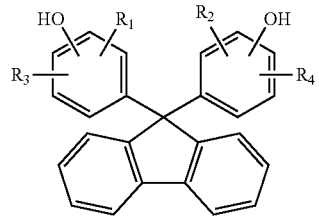

(H)

wherein $R_1$ to $R_4$ are each independently a hydrogen atom, a hydrocarbon group with 1 to 9 carbon atoms which may contain an aromatic group, or a halogen atom; or

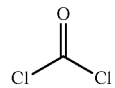

(I)

wherein $R_1$ is an isosorbide unit and $R_2$-$R_9$ are each independently a hydrogen, a halogen, a $C_1$-$C_6$ alkyl, a methoxy, an ethoxy, or an alkyl ester; and (iii) a difunctional chain extender having the structure of one of the following Formulas (21)-(24):

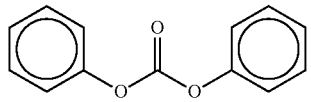

Formula (21)

Formula (22)

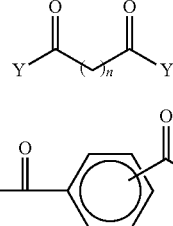

Formula (23)

Formula (24)

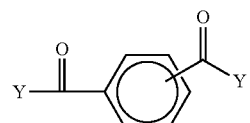

where Y is hydroxyl, halogen, alkoxy, or aryloxy; and where n is 1 to 20.

2. The additive of claim 1, wherein the reaction further comprises an end-capping agent selected from the group consisting of phenol, p-t-butylphenol, p-cumylphenol, octylphenol, and p-cyanophenol.

3. The additive of claim 1, wherein the reaction that forms the photoactive additive further comprises a secondary linker moiety having at least three functional groups, each of which can react with a functional group of the first linker moiety.

4. The additive of claim 1, wherein the additive is an oligomer having a weight average molecular weight of less than 15,000, or wherein the additive is a polymer having a weight average molecular weight of 15,000 or higher.

5. The additive of claim 1, wherein the molar ratio of the benzophenone to the first linker moiety is from 1:2 to 1:200.

6. The additive of claim 1, wherein the additive is formed from the reaction of the benzophenone of Formula (1), the first linker moiety, and a difunctional chain extender.

7. The additive of claim 6, wherein the first linker moiety is bisphenol-A, and the difunctional chain extender is phosgene.

8. The additive of claim 1, wherein the additive is formed from the reaction of the benzophenone of Formula (2) or (3), the first linker moiety, a difunctional chain extender, and an end-capping agent.

9. A product formed from a composition comprising the photoactive additive of claim 1.

10. The product of claim 9, wherein the product is at least one of an automotive bumper, an automotive exterior component, an automobile mirror housing, an automobile grille, an automobile pillar, an automobile wheel cover, an automobile instrument panel or trim, an automobile glove box, an automobile door hardware or other interior trim, an automobile exterior light, an automobile part within the engine compartment, an agricultural tractor or device part, a construction equipment vehicle or device part, a construction or agricultural equipment grille, a marine or personal water craft part, an all terrain vehicle or all terrain vehicle part, plumbing equipment, a valve or pump, an air conditioning heating or cooling part, a furnace or heat pump part, a computer part, a computer router, a desk top printer, a large office/industrial printer, an electronics part, a projector part, an electronic display part, a copier part, a scanner part, an electronic printer toner cartridge, a hair drier, an iron, a coffee maker, a toaster, a washing machine or washing machine part, a microwave, an oven, a power tool, an electric component, an electric enclosure, a lighting part, a dental instrument, a medical instrument, a medical or dental lighting part, an aircraft part, a train or rail part, a seating component, a sidewall, a ceiling part, cookware, a medical instrument tray, an animal cage, fibers, a laser welded medical device, fiber optics, a lense (auto and non-auto), a cell phone part, a greenhouse component, a sun room component, a fire helmet, a safety shield, safety glasses, a gas pump part, a humidifier housing, a thermostat control housing, an air conditioner drain pan, an outdoor cabinet, a telecom enclosure or infrastructure, a Simple Network Detection System (SNIDS) device, a network interface device, a smoke detector, a component or device in a plenum space, a medical scanner, X-ray equipment, a construction or agricultural equipment, a hand held electronic device enclosure or part, a walkie-talkie enclosure or part, a scanner enclosure or part, a media/MP3/MP4 player enclosure or part, a radio enclosure or part, a GPS system enclosure or part, an ebook enclosure or part, a tablet enclosure or part, a wearable electronic device, a smart watch, a wearable training/tracking device, a wearable activity/sleep monitoring system, a wearable electronic wristband, electronic glasses, a hand held tool enclosure or part, a smart phone enclosure or part, and a turbine blade.

11. The product of claim 9, wherein the product is transparent, or has a thin wall having a cross-section of 3 mm or less.

12. A blend comprising the additive of claim 1 and a polymeric base resin that is different from the photoactive additive.

13. The blend of claim 12, further comprising a flame retardant that is potassium perfluorobutane sulfonate (Rimar salt), potassium diphenyl sulfone-3-sulfonate (KSS), or a combination thereof.

14. A process for improving at least one property of a product produced from a polymeric base resin, comprising:
blending with the polymeric base resin the photoactive additive of claim 1 to produce a blend;
forming the product from the blend; and
exposing a surface of the formed product to an effective dosage of ultraviolet radiation to cause crosslinking on the surface of the product.

15. The process of claim 14, wherein the improved property is selected from the group consisting of anti-drip, flame retardance, chemical resistance, tear resistance, impact strength, ductility, hydrolytic stability, and weatherability.

16. The process of claim 14, wherein the UV radiation is filtered using a 280 nm long pass filter to provide no detectable UVC radiation, as measured using an EIT PowerPuck.

17. The process of claim 14, wherein the UV radiation source is a metal halide doped mercury lamp, an electrodeless D-bulb, an electrodeless H-bulb, an electrodeless V-bulb, a Xenon Arc lamp, or a UVA (320-390 nm) light emitting diode (LED).

18. A crosslinked layer formed from a polymeric blend that has been exposed to UV radiation, the blend comprising:
the photoactive additive of claim 1; and
a polymer resin which is not the photoactive additive.

19. The layer of claim 18, wherein the crosslinked layer contains chains from both the photoactive additive and the polymer resin.

20. The layer of claim 18, wherein the crosslinking is sufficient to create a continuous insoluble layer containing both the photoactive additive and the polymer resin.

21. The layer of claim 18, wherein the crosslinked layer is formed by exposure to 36.0 J/cm$^2$ of UVA radiation and no detectable UVC radiation.

22. A composition comprising a cross-linked polycarbonate, the cross-linked polycarbonate derived from a cross-linkable polycarbonate resin formed from the photoactive additive of claim 1.

23. The composition of claim 22, wherein the cross-linkable polycarbonate resin contains from about 0.5 mole % to about 5.0 mole % of endcaps derived from the benzophenone according to Formula (1).

24. The composition of claim 22, wherein the cross-linkable polycarbonate resin contains from about 0.5 mole % to about 50 mole % of the benzophenone according to Formula (2) or (3).

25. A photoactive additive formed from the reaction of:
a benzophenone having one substituent that comprises a divalent linker and a linking group, wherein the linking group is a carboxyl group, ester group, or acid halide group;
a first linker moiety bisphenol-A; and
a difunctional chain extender phosgene.

26. The additive of claim 25, wherein the benzophenone has the structure of Formula (1):

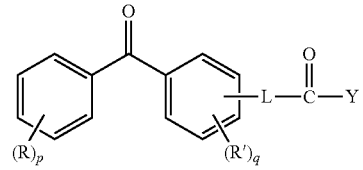

Formula (1)

wherein R and R' are independently alkyl, aryl, alkenyl, halogen, sulfonate, phosphate, phosphonate, nitrile, thiophene, or pyrrole; p is an integer from 0 to 5; q is an integer from 0 to 4; and L is a single bond, oxyalkylene, alkyl, aryl, alkenyl, substituted alkyl, substituted aryl, substituted alkenyl, or amino; and Y is hydroxyl, alkoxy, aryloxy, or halogen; or an anhydride thereof.

27. The additive of claim 25, wherein the reaction that forms the photoactive additive further comprises a secondary linker moiety having at least three functional groups, each of which can react with the hydroxyl groups of the bisphenol-A.

28. The additive of claim 25, wherein the additive is an oligomer having a weight average molecular weight of less than 15,000, or wherein the additive is a polymer having a weight average molecular weight of 15,000 or higher.

* * * * *